US012034448B2

(12) United States Patent
Lam et al.

(10) Patent No.: US 12,034,448 B2
(45) Date of Patent: Jul. 9, 2024

(54) REDUCING NON-LINEARITIES OF A PHASE ROTATOR

(71) Applicant: Ciena Corporation, Hanover, MD (US)

(72) Inventors: Jerry Yee-Tung Lam, Stittsville (CA); Sadok Aouini, Gatineau (CA); Naim Ben-Hamida, Nepean (CA)

(73) Assignee: Ciena Corporation, Hanover, MD (US)

( * ) Notice: Subject to any disclaimer, the term of this patent is extended or adjusted under 35 U.S.C. 154(b) by 3 days.

(21) Appl. No.: 17/944,364

(22) Filed: Sep. 14, 2022

(65) Prior Publication Data

US 2023/0006680 A1 Jan. 5, 2023

Related U.S. Application Data

(63) Continuation of application No. 17/318,118, filed on May 12, 2021, now Pat. No. 11,463,093.

(51) Int. Cl.
| | |
|---|---|
| *H03L 7/081* | (2006.01) |
| *H03L 7/099* | (2006.01) |
| *H03L 7/197* | (2006.01) |
| *H04L 7/00* | (2006.01) |
| *H04L 7/033* | (2006.01) |

(52) U.S. Cl.
CPC .......... *H03L 7/0814* (2013.01); *H03L 7/0994* (2013.01); *H03L 7/1976* (2013.01); *H04L 7/0037* (2013.01); *H04L 7/033* (2013.01)

(58) Field of Classification Search
CPC ....... H03L 7/081; H03L 7/0814; H04L 7/033; H04L 7/0337; H04L 7/00; H04L 7/0016; H04L 7/0033; H04L 7/0037
See application file for complete search history.

(56) References Cited

U.S. PATENT DOCUMENTS

| | | | |
|---|---|---|---|
| 8,451,870 B1 | 5/2013 | Kurowski et al. | |
| 8,849,882 B2 | 9/2014 | Aouini et al. | |
| 8,855,215 B2 | 10/2014 | Roberts et al. | |
| 10,187,197 B2 | 1/2019 | Aouini et al. | |
| 10,281,523 B2 | 5/2019 | Aouini et al. | |
| 10,320,374 B2 | 6/2019 | Parvizi et al. | |
| 10,330,962 B1 | 6/2019 | Calvo et al. | |
| 10,374,623 B1 | 8/2019 | Oveis Gharan et al. | |
| 10,425,099 B1 | 9/2019 | Aouini et al. | |
| 10,536,303 B1 | 1/2020 | Pike et al. | |

(Continued)

FOREIGN PATENT DOCUMENTS

| | | |
|---|---|---|
| CA | 2206738 A1 | 12/1998 |
| CA | 2269914 A1 | 12/1998 |

(Continued)

*Primary Examiner* — Ryan Johnson
(74) *Attorney, Agent, or Firm* — Baratta Law PLLC; Lawrence A. Baratta, Jr.

(57) ABSTRACT

Circuits, controllers, and techniques are provided for reducing non-linearities in a phase rotator. A card include first transmit (Tx) component configured to connect to a second receive (Rx) component in a second card; a first Rx component configured to connect to a second Tx component in the second card; a single Phase-Locked Loop (PLL) circuit connected to both the first Tx component and the first Rx component; and a control circuit configured to compensate for differences between i) the first Tx component and the second Rx component, and ii) the first Rx component and the second Tx component.

20 Claims, 27 Drawing Sheets

(56) References Cited

U.S. PATENT DOCUMENTS

| | | | |
|---|---|---|---|
| 10,554,453 B1 | 2/2020 | Parvizi et al. | |
| 10,678,112 B2 | 6/2020 | Parvizi et al. | |
| 10,680,585 B2 | 6/2020 | Aouini et al. | |
| 10,715,155 B1 | 7/2020 | Parvizi et al. | |
| 10,715,169 B1 | 7/2020 | Aouini et al. | |
| 10,727,854 B1 | 7/2020 | Greshishchev et al. | |
| 10,749,536 B1 | 8/2020 | Aouini et al. | |
| 10,805,064 B1 | 10/2020 | Aouini et al. | |
| 10,826,514 B1 | 11/2020 | Honarparvar et al. | |
| 10,848,164 B1 | 11/2020 | Wen et al. | |
| 10,855,380 B2 | 12/2020 | Aouini et al. | |
| 10,903,841 B1 | 1/2021 | Parvizi et al. | |
| 10,931,292 B1 | 2/2021 | Shalmani et al. | |
| 10,938,405 B1 | 3/2021 | Honarparvar et al. | |
| 10,965,300 B1 | 3/2021 | Weng et al. | |
| 10,979,059 B1 | 4/2021 | Shalmani et al. | |
| 10,985,900 B1 | 4/2021 | Abdo et al. | |
| 11,231,741 B1 | 1/2022 | Buchwald | |
| 2002/0009170 A1 | 1/2002 | Schmatz | |
| 2004/0201913 A1 | 10/2004 | Sutardja et al. | |
| 2007/0285138 A1 | 12/2007 | Bhowmik et al. | |
| 2008/0122503 A1* | 5/2008 | Okuda | G06F 1/10 327/149 |
| 2018/0331818 A1 | 11/2018 | Aouini et al. | |
| 2020/0177194 A1 | 6/2020 | Aouini et al. | |

FOREIGN PATENT DOCUMENTS

| | | |
|---|---|---|
| EP | 3217559 B1 | 9/2017 |
| WO | 2021076254 A1 | 4/2021 |
| WO | 2021076255 A1 | 4/2021 |

\* cited by examiner

210

| | NO INTERPOLATION | INTERPOLATION x 2 | INTERPOLATION x 4 | INTERPOLATION x 8 |
|---|---|---|---|---|
| NO LUT | 131.41 | 130.14 | 96.72 | 96.52 |
| PPM: | | | | |
| 12 | 34.29 | 32.46 | 31.04 | 32.61 |
| 24 | 34.63 | 34.06 | 33.86 | 35.30 |
| 48 | 39.67 | 35.33 | 33.95 | 35.79 |
| 72 | 46.08 | 36.62 | 37.21 | 36.84 |
| 96 | 53.33 | 39.06 | 38.79 | 40.37 |

220

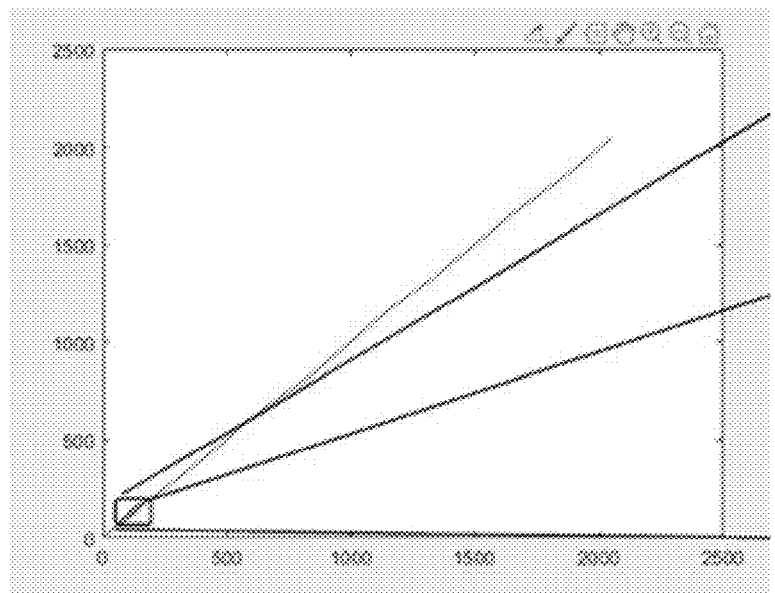
FIG. 15A
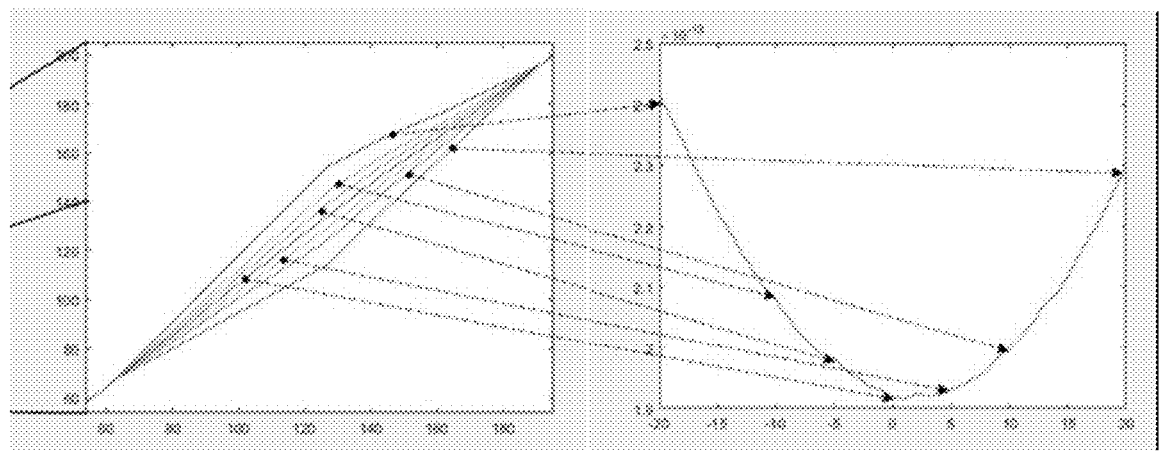
FIG. 15B FIG. 15C

REDUCING NON-LINEARITIES OF A PHASE ROTATOR

CROSS-REFERENCE TO RELATED APPLICATION(S)

The present disclosure is a continuation of U.S. patent application Ser. No. 17/318,118, filed May 12, 2021, the contents of which are incorporated by reference in their entirety.

FIELD OF THE DISCLOSURE

The present disclosure generally relates to phase rotators. More particularly, the present disclosure relates to systems and methods for improving the linearization of a phase rotator connected to an output of a Phase-Locked Loop (PLL) by continuously updating operating code stored in a Look-Up Table (LUT).

BACKGROUND OF THE DISCLOSURE

Phase-Locked Loops (PLLs) are often used to reduce phase shift between an input and output within a system. A PLL normally includes a phase comparator, a filter (e.g., low pass filter), and a Voltage Controlled Oscillator (VCO) along a main path from an input to an output of the PLL. The output from the VCO is fed back to the phase comparator in a feedback loop to allow the phase comparator to detect any shift in phase and adjust the VCO accordingly to match the phases.

A common solution for resolving clock reference drift between a transmitter and a receiver is to use separate PLLs for the transmitter and receiver and allowing each PLL to produce a frequency offset by adjusting the VCO frequency and/or by rotating a phase rotator inside the PLL feedback loop, allowing the PLL to attenuate any phase rotator induced jitter. However, with two PLLs in this case, the power and area requirements are greatly increased on a circuit board.

A conventional solution to separate PLL phase ramping is to use a clock rate of a digital core as an update rate for the phase rotator. Phase rotators are not commonly used in a continuous ramp to implement frequency offsets without including them directly within the feedback loop. The location of the phase rotators within the feedback loop can filter non-linear responses so that the phase rotator induced jitter is less of an issue. For architectures using a single PLL, the out-of-loop response is typically important, such that minimizing jitter can be critical through all available methods. However, this may also be potentially problematic in cases where it is desirable to further reduce digital core frequency for reducing power.

The conventional systems include various shortcomings. For example, the use of a second PLL greatly increases power and area requirements. Also, operating at the digital core rate can restrict the update rate and can subject the update rate to affects from other system conditions (e.g., data rate, digital core power, etc.). If low rates are used due to power, this can add an artificial floor onto the jitter parameter.

Furthermore, conventional solutions for linearizing phase rotators can be configured to reduce linearization errors by placing them within the feedback loop of a PLL. Calibration can be performed in the lab or by using special start-up circuits to perform a self-test. However, using the phase rotator within the feedback loop itself restricts the ability to generate multiple clock frequencies (e.g., so as to track jitter frequency errors). Thus, a separate PLL may be required in this case for each clock (e.g., such as a clock for each of the transmitter and receiver). Also, using start-up "foreground" calibration requires the design to maintain calibration over its operating lifetime, especially if it cannot be taken offline for recalibration. Thus, after putting a circuit in use, it may be impossible to change these initial calibration settings and compensate for certain types of changes (e.g., aging effects, effects from voltage shifts, temperature changes, etc.). Therefore, there is a need in the field of PLLs and phase rotation control circuitry to avoid the above-mentioned deficiencies and provide improved linearization of phase rotators.

BRIEF SUMMARY OF THE DISCLOSURE

The present disclosure describes systems, circuits, and techniques for improving linearization of phase rotation systems. According to one embodiment, a circuit includes a single Phase-Locked Loop (PLL) circuit having a main path and a return path forming a feedback loop. The circuit also includes one or more phase rotators connected to an output of the single PLL circuit outside the feedback loop and one or more adaptable Look-Up Tables (LUTs) populated with operating code to be provided to the one or more phase rotators for defining operating characteristics of the one or more phase rotators. Furthermore, the circuit includes a control device configured to receive phase response characteristics from the one or more phase rotators. The control device is further configured to modify the operating code of the one or more adaptable LUTs based on the phase response characteristics to reduce non-linearities of the one or more phase rotators.

According to additional embodiments, the one or more phase rotators of the circuit may include a first phase rotator associated with a transmitter component and a second phase rotator associated with a receiver component. The transmitter component and receiver component are configured to share the single PLL circuit. The circuit may also include a Clock and Data Recovery (CDR) circuit configured to receive output signals from the receiver component and provide input signals to one of the one or more adaptable LUTs and to the control device. The one or more phase rotators are configured for continuous operation, and wherein the control device is configured to iteratively modify the operating code of the one or more adaptable LUTs based on changeable phase response characteristics of the one or more phase rotators to allow the control device to improve linearization performance of the one or more phase rotators. Also, the control device may be configured to compensate for the changeable phase response characteristics caused by errors due to temperature changes, voltage shifts, and aging effects.

In additional embodiments, the circuit may further include one or more linear ramps configured to shift the output frequency of the one or more phase rotators. The control device may be configured to modify the operating code of the one or more adaptable LUTs to improve the linearization of the one or more linear ramps. The one or more adaptable LUTs may be configured to correct phase errors in the one or more phase rotators. Also, the control device may include an Integrated Digital-to-Analog Converter (IDAC) coding component configured for background calibration of the one or more adaptable LUTs. The IDAC coding component may be configured to receive interpolation information from an interpolator, wherein the interpolator can include a clock configured to control an update rate at which the IDAC coding component modifies the operating code of the one or more adaptable LUTs. The clock may operate faster than a digital core rate associated with the one or more adaptable LUTs, wherein the IDAC coding component may be configured to interpolate intermediate code between the operating code associated with the digital core rate.

Furthermore, the circuit may also include one or more phase rotator controllers configured to receive the operating code from the one or more adaptable LUTs and apply the operating code to the one or more phase rotators. and one or more frequency dividers each connected to an output of the one or more phase rotators. Also, the circuit may include a spectrum analyzer configured to measure the phase response characteristics from the one or more phase rotators and forward the phase response characteristics to the control device. The control device may be configured to provide an incremental step to an accumulator associated with a digital core connected to the one or more phase rotator controllers. For example, the spectrum analyzer may be configured to perform a trial offset process, where the trial offset process may include applying different sets of test operating code to the one or more adaptable LUTs, monitoring non-linearities of the one or more phase rotators to determine a set of test operating code having the best results, and replacing the operating code with the set of test operating having the best results.

BRIEF DESCRIPTION OF THE DRAWINGS

The present disclosure is illustrated and described herein with reference to the various drawings, in which like reference numbers are used to denote like system components/ method steps, as appropriate, and in which:

FIGS. 15A-15C are graphs showing aspects of a test offset process for improving Look-Up Table (LUT) operating code, according to various embodiments of the present disclosure.

DETAILED DESCRIPTION OF THE DISCLOSURE

Figure 1:
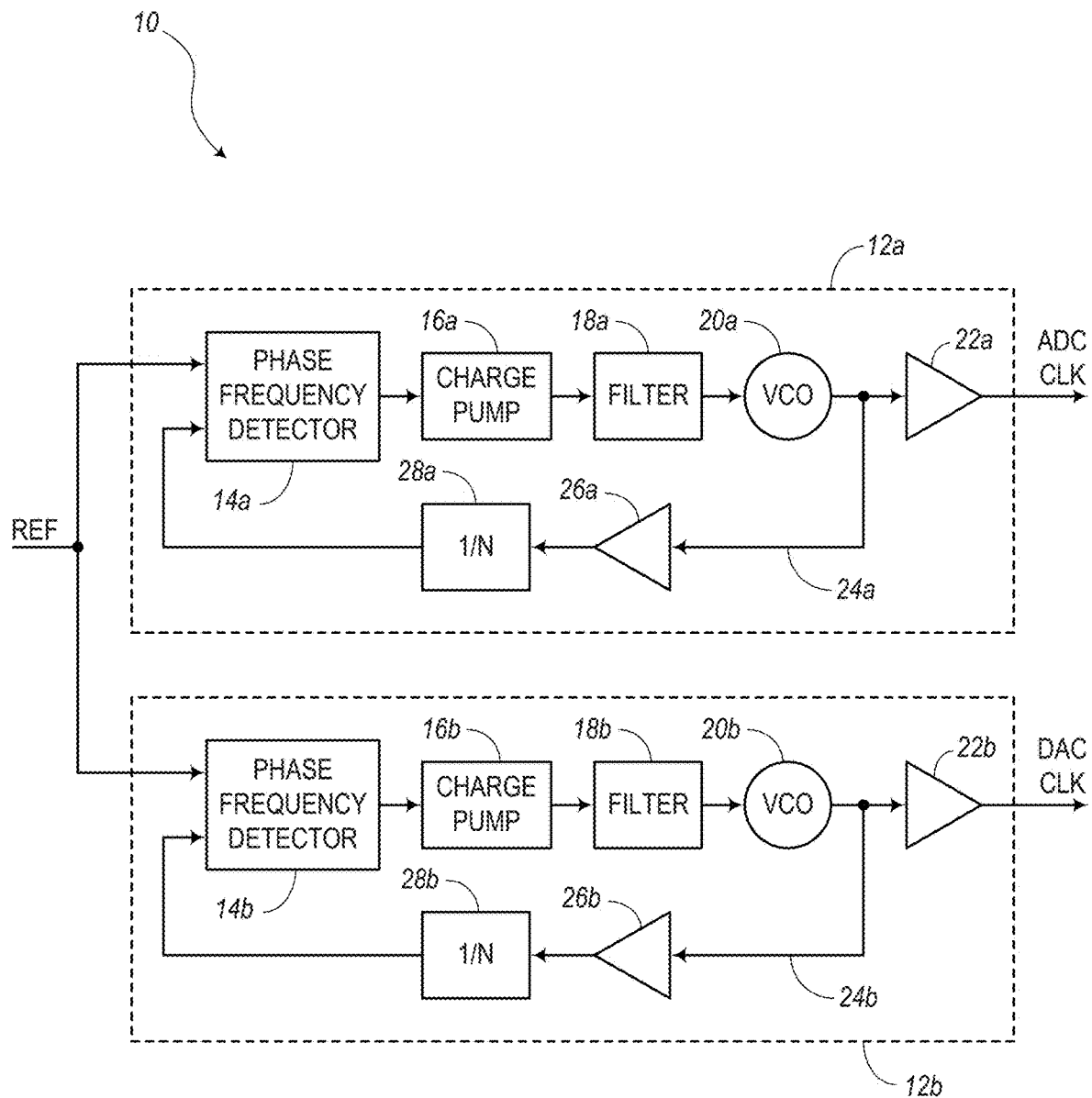
FIG. 1 is a schematic diagram illustrating a dual Phase-Locked Loop (PLL) circuit, according to various embodiments.

In various embodiments, the present disclosure relates to systems and methods for performing linearization techniques to reduce non-linearities of phase rotators or phase shifters. In particular, one or more phase rotators may be connected to an output of a Phase-Locked Loop (PLL) circuit, yet outside the perimeter of the feedback loop of the PLL. In some embodiments of the present disclosure, each of the phase rotators may receive phase modifying signals from a linear ramp. Ideally, the linear ramp provides signals with perfect linearity. However, in reality, these linear ramps may include non-linearities that prevent the phase rotators from operating at an optimal level. Thus, the embodiments of the present disclosure are configured to utilize a Look-Up Table (LUT) for each linear ramp, where the LUT can be updated continuously to provide operating code that can improve the linearity of the linear ramps and thus improve the operability of the phase rotators.

Digital core processors may be configured to provide clock signals at a predetermined rate. However, to improve the operation of the phase rotators according to some embodiments, the LUTs can be updated at a rate that is higher than the clock rate of the digital core processor. This can be done by an up-sampling technique where more updated samples can be processed than would normally be possible at the regular clock speed. The up-sampling techniques of the present disclosure include an interpolation process for interpolating samples between the normal samples defined by the processor speed. The up-sampling circuit of the present disclosure can increase the effective digital core rate, making it partially independent of the core rate, while still allowing the phase rotator to be updated at a sufficiently fast rate. This keeps jitter low enough to allow for a phase rotator to be placed outside the feedback loop of the PLL and avoids the need for a second PLL.

The present disclosure provides systems and methods that enable highly linear phase rotators. A linearity performance level of the present circuits and systems is sufficient to enable continuous rotation of the phase rotators outside of the PLL feedback loop, which allows two or more separate components (e.g., a transmitter (Tx) and a receiver (Rx)) to share the single PLL, while each using its own phase rotator.

Calibration of the operating code information stored in the LUTs can run continuously while the phase rotators are in operation. Thus, the embodiments of the present disclosure are configured to compensate for errors that may appear, including temperature shifts, voltage shifts, effects caused by the aging of the phase rotators and other related components, among other issues.

In order to compensate for offsets in frequency references, separate PLLs are typically required for transceiver systems so that the PLL can lock onto different frequencies. However, to save power and area on a circuit board, it is possible to use a single PLL with two or more separate phase rotators. As mentioned above, each phase rotator can be fed a linearly increasing signal from a linear ramp to create the required frequency shift.

The embodiments of the present disclosure are configured to provide techniques for calibrating an LUT associated with the PLL and phase rotators to properly linearize the characteristics of the phase rotators. The systems and methods of the present disclosure have an advantage over conventional systems in that the present circuits do not use static time-based characterization and are able to minimize the amount of equipment needed. Also, since the present techniques are configured to operate the phase rotators in continuous rotation, the present circuits are able to account for transient effects by calibrating the LUTs during continuous use. The present methods are configured to run while the phase rotators are in operation, allowing for continuous background calibration. In this context, "background calibration" refers to calibration conducted at a back-end of a system or circuit, after accumulation steps, applying operating code from an LUT, and interpolation steps. The background calibration may include phase rotation calibration of Integrated Digital-to-Analog (IDAC) coding, which may then be applied to the LUT for updating the operating code stored in the LUT.

The present disclosure can be used on a continuous linear phase ramp associated with a phase rotator to shift the output frequency of a PLL. Also, the present embodiments can be used in a clock recovery circuit to reduce the power of a system. For example, by using a single PLL for shared Tx and Rx components, the system can save power. To track frequency drifts between Tx and Rx blocks of different modules, the phase rotator may be rotated to generate the needed frequency offset.

FIG. 1 is a schematic diagram illustrating an embodiment of a dual Phase-Locked Loop (PLL) circuit 10. The dual PLL circuit 10 includes a first PLL 12a and a second PLL 12b. A reference signal (REF) is applied to a phase frequency detector 14a, 14b of the PLLs 12a, 12b, respectively. Along a main path of the respective PLL 12a, 12b, the phase frequency detector 14a, 14b provides an output to a charge pump 16a, 16b, a filter 18a, 18b (e.g., low pass filters), and a Voltage Controlled Oscillator (VCO) 20a, 20b. The VCO 20a, 20b provides an output through a respective amplifier 22a, 22b. The output of the first PLL 12a is an Analog-to-Digital Converter (ADC) clock signal (ADC CLK) and the output of the second PLL 12b is a Digital-to-Analog Converter (DAC) clock signal (DAC CLK). For example, the ADC CLK may be fed to a Rx component and the DAC CLK may be fed to a Tx component.

In addition, according to typical PLL architecture, the VCO 20a, 20b is configured to also provide the output back to the respective phase frequency detector 14a, 14b along feedback loops 24a, 24b. In this embodiment, the feedback loops 24a, 24b may also include an amplifier 24a, 24b and a frequency divider 28a, 28b, respectively. The signals that are fed back to the phase frequency detectors 14a, 14b along feedback paths 24a, 24b are configured to allow the phase frequency detectors 14a, 14b to compare the input and output phases and modify the VCO 20a, 20b to match the output phase with the input phase. However, as mentioned above, the dual PLL circuit 10, which includes the two PLLs 12a, 12b, will use more power and take up more real estate on a circuit board compared to a system with only a single PLL.

Figure 2:
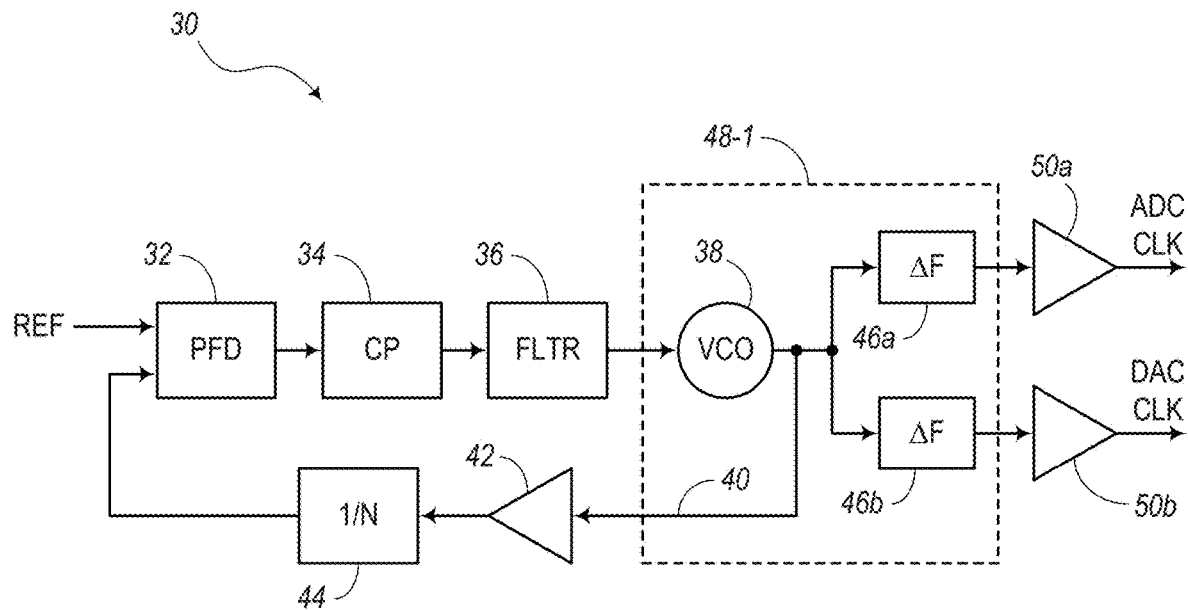
FIG. 2 is a schematic diagram illustrating a single PLL circuit, according to various embodiments of the present disclosure.

FIG. 2 is a schematic diagram illustrating an embodiment of a single PLL circuit 30. In this embodiment, the single PLL circuit 30 includes a Phase Frequency Detector (PFD) 32, a Charge Pump (CP) 34, a filter 36 (e.g., low pass filter), and a VCO 38 along a main path from an input of the single PLL circuit 30 to an output thereof. Also, the VCO 38 is configured to provide a feedback signal along a return path 40, whereby the main path and the return path 40 in combination form a feedback loop. In this embodiment, the return path 40 includes an amplifier 42 and a frequency divider (1/N) 44, whereby feedback signals from the VCO 38 are fed to the PFD 32 for phase comparison purposes.

Also, to enable the application of the PLL clock signals to two different components (e.g., a Tx component and a Rx component), the single PLL circuit 30 in this embodiment includes differential frequency components 46a, 46b. According to some embodiments, the VCO 38 and differential frequency components 46a, 46b may form a phase rotation circuit 48-1. The first differential frequency component 46a may be configured to supply output signals of an ADC CLK via a first amplifier 50a, and the second differential frequency component 46b may be configured to supply output signals of a DAC CLK via a second amplifier 50b.

Figure 3:
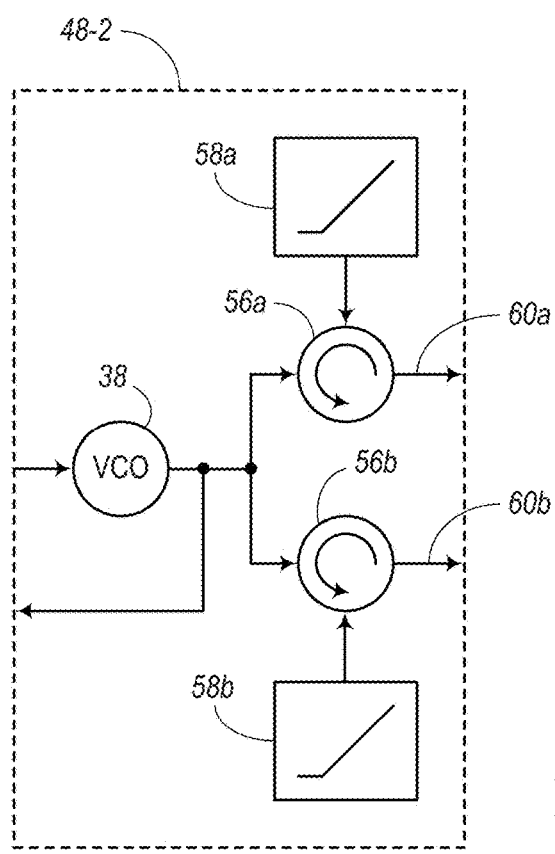
FIG. 3 is a schematic diagram illustrating a phase rotation circuit connected to an output of a PLL, according to various embodiments of the present disclosure.

FIG. 3 shows another embodiment of a phase rotation circuit 48-2, which may be similar to the phase rotation circuit 48-1 shown in FIG. 2 and may be incorporated in the single PLL circuit 30 or other suitable PLL circuit for providing phase rotating functionality. More particularly, the phase rotation circuit 48-2 may be connected to an output of a PLL (e.g., at the output of the VCO 38) and positioned outside the feedback loop (e.g., outside the loop formed by the main path plus the return path 40 shown in FIG. 2). In this embodiment, the phase rotation circuit 48-2 includes the VCO 38 and an output 54 (of the PLL). The output 54 is fed to a first phase rotator 56a and a second phase rotator 56b. The phase rotation circuit 48-2 further includes a first linear ramp device 58a that feeds a linearly increasing signal to the first phase rotator 56a and a second linear ramp device 58b that feeds a linearly increasing signal to the second phase rotator 56b. Outputs 60a, 60b of the phase rotation circuit 48-2 are supplied by the first and second phase rotators 56a, 56b, respectively.

It should be noted that the quality of a frequency shift of a PLL is sensitive to many different performance parameters of the phase rotators 56a, 56b. Maintaining a low noise clock signal from the PLL include tuning the phase rotators 56a, 56b to reduce non-linearities. While the phase rotators 56a, 56b may be designed specifically to minimize non-linearities, some non-linearities may still remain in the phase rotation circuit 48-2 (or other similar phase rotation circuits). In some cases, these non-linearities cannot be corrected by conventional systems. For examples, some non-linearities may be caused by natural non-linear transistor characteristics (e.g., process variations that affects a batch of chips, sample mismatch variations that affect performance, and other variations from one die to another) as well as variation caused by voltage shifts, temperature changes, and changes caused by the degradation or other effects of natural aging of the circuit components.

According to various embodiments of the present disclosure, as described in more detail below, the phase rotators 56a, 56b and linear ramp devices 58a, 58b can be adjusted as needed to create outputs 60a, 60b with a more linear response, thereby improving the operational performance of the phase rotation circuit 48-2. Thus, the systems and methods of the present disclosure are configured to compensate for the non-linearities of the phase rotation circuit 48-2. For example, according to some implementations, a Look-Up Table (LUT) can be used to feed operating code to each respective pair of the phase rotators 56a, 56b and linear ramp devices 58a, 58b.

The LUTs are configured to take input codes that represents a perfect, linear phase rotator response and add predetermined offsets so that the phase rotator creates the actual phase shift desired by the input code. If the phase rotators 56a, 56b are not perfectly compensated for by the LUTs, then the resulting phase errors will show up as clock spurs and jitter when the phase rotators 56a, 56b are rotated to create a frequency shift. To determine if the compensation is adequate, trial offsets can be made to the LUT and the jitter can be monitored. At first, small offsets (e.g., in both the positive and negative directions) can be made to multiple test values. If one of them leads to an improved response, additional steps can be taken in an attempt to continue to reduce jitter further. According to various implementations, the test values can be selected prudently. For example, if an offset is too long, then only broad non-linearities spanning many codes can be compensated for. If offset is too short, more jitter may be introduced thereby preventing the trial from determining if any improvement has been made. Once the best offsets are determined, they can be kept (e.g., stored in the LUT) and these steps can be repeated with an offset at a different location in the LUT.

This technique may require high linearity in the phase rotators 56a, 56b. However, since the phase rotators 56a, 56b are located outside of the feedback path of the PLL, any error in their response would lead to phase jitter or spurs in the output waveforms. One way to improve the response is by increasing the update rate (e.g., up-sampling) of the phase rotator ramp (e.g., linear ramp devices 58a, 58b). If the phase rotator is updated very slowly, the ramp signal will be turned into a large step response as shown in FIG. 4.

Figure 4:
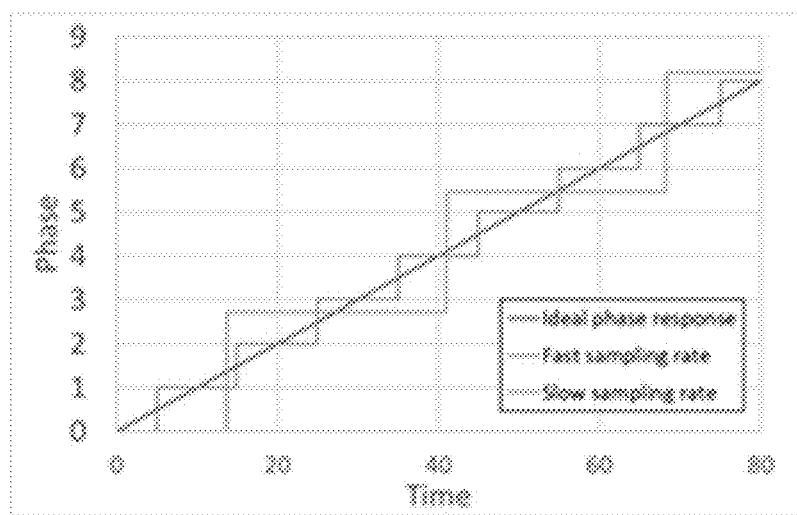
FIG. 4 is a graph showing phase responses using fast and slow sampling rates compared with an ideal phase response, according to various embodiments of the present disclosure.

FIG. 4 is a graph 64 showing phase responses using fast and slow sampling rates compared with an ideal (linear) phase response. It should be noted that even if the phase rotator 56a, 56b has perfect linearity, the sampling rate of the respective linear ramp devices 58a, 58b can still lead to a poor output signal since the large steps will be turned into spurs.

Figure 5:
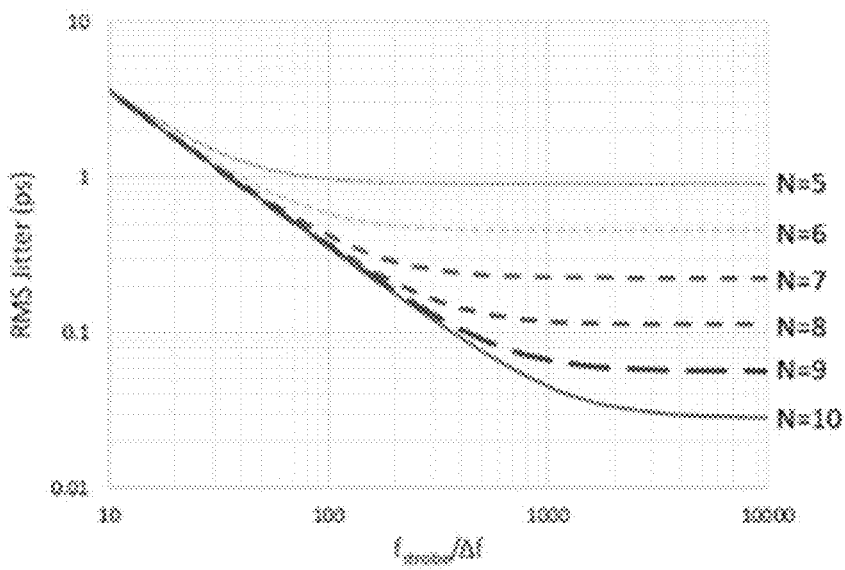
FIG. 5 is a graph showing jitter of a phase rotator system based on update rate, according to various embodiments of the present disclosure.

FIG. 5 is a graph 66 showing Root Mean Squared (RMS) clock jitter (in picoseconds (ps)) of a phase rotator system versus update rate. The update rate is based on a strobe frequency ($f_{strobe}$) divided by a difference in frequency ($\Delta f$). The graph 66 strobe, shows simulated phase rotator systems and how update rate can limit phase rotator linearity. N is the number of bits. This diagram shows the jitter versus strobe frequency ratio (ratio of the strobe frequency to the operating frequency) with different number of bits in the control signal. So, N=5 represents a phase rotator with $2^5$=32 steps total. N=6 represents a phase rotator with 64 ($2^6$) steps, etc.

As described in more detail below, an interpolator can be used in a phase rotation system when an update rate is increase (e.g., when up-sampling is enabled). For example, the interpolator may operate by linearly interpolating between successive phase rotator codes after an LUT correction. The interpolation may be performed by binary arithmetic (e.g., by adding two numbers, shifting bits to divide by 2) for minimal power cost. Since the codes interpolated intermediately have been corrected with the LUT, further non-linear correction may not be needed as long as the step size is small.

Several interpolation modes may be possible according to various embodiments of the present disclosure. The interpolation modes may be indicated by a two-digit binary code, such as Mode 00, Mode 01, Mode 10, and Mode 11, described in more detail below with respect to FIG. 10. In this example, Mode 00 may be configured to disable interpolation completely, Mode 01 may be configured to interpolate at a ×2 base clock rate (i.e., two times the clock rate of a digital core processor), Mode 10 may be configured to interpolate at a ×4 rate, and Mode 11 may be configured to sample every other input code and sample at a rate of 8 times the divided down rate (e.g., four times the base clock rate).

In some embodiments, a process may include a first step of re-timing the input data with the local clock. This may introduce possible timing margin issues since the phase relationship between the interpolation clock and the code from the digital core may be indeterminate. Thus, a phase selector can be added so the interpolation clock phase can be inverted instead. The re-timing clock can be divided down to reduce the resampling rate. In future iterations, variable dividers can be used (e.g., divide by 3 or 5) to match the mismatching interpolation clock and the digital core rate (e.g., matching a sampling frequency of 768 ps to a sampling frequency of 160 ps).

The interpolation clock can also be divided down to generate intermediate clocks needed to control multiplexers and other logic blocks. Unused clock blocks can be gated to save power. A shift register may be configured to store a previous code, which can be fed into the averaging chain to create up to eight interpolated values between the two codes. As not all codes are used (depending on the Mode), the averaging blocks that are not needed can be disabled to save power. A mux can be configured to alternate between the interpolated values based on the intermediate clocks generated to output the interpolated codes in the correct order. A new strobe clock is generated and used to re-time the output code to maximize timing margin response.

Figure 6:
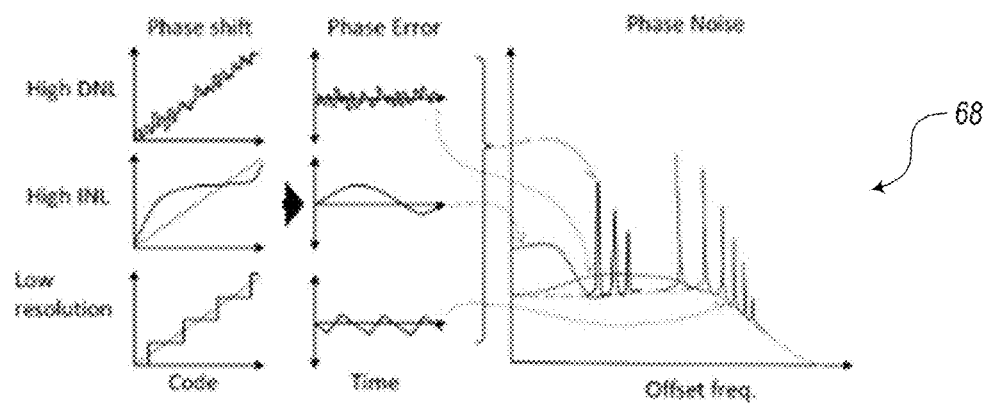
FIG. 6 is a graph showing the effects of various phase rotator deficiencies on the overall noise of a system, according to various embodiments of the present disclosure.

FIG. 6 shows a group of graphs 68 to demonstrate the effects of various phase rotator deficiencies on the overall noise of a system. The first column shows graphs of phase shifts with high Differential Non-Linearity (high DNL), high Integral Non-Linearity (high INL), and low resolution. The second column shows graphs of phase errors over time for the high DNL, high INL, and low resolution phase shifts. The last column shows a graph of the phase noise with respect to offset frequency and includes an accumulation of the phase errors shown in the second column. The graphs 68 show how phase rotator impairments can affect jitter response. To improve the jitter response, the update rate of the phase rotator can be increased. Otherwise, as depicted in the graphs 68, the jitter will reach a floor and cannot be improved, even with a higher resolution phase rotator.

Typically, the update rate will come from the digital core processor. Hence, the maximum rate is normally limited to what is desired for the core. The update rate may be based on certain factors, such as data rate, sample rate, power consumption, and logic performance. In conventional systems, the phase rotator performance is not typically a priority, despite the impact that it can have on system performance. As such, the rate is typically much lower than what the phase rotator can support. The embodiments of the present disclosure are configured to increase the update rate (by interpolation) to provide better linearity of the phase rotators.

The present disclosure increases the phase rotator effective update rate beyond the clock rate of the digital core processor by using a faster clock while determining the correct intermediate code between digital core clock samples. As the LUT of the phase rotator is essential in eliminating various process and mismatch variations, the interpolation circuit describe in the present disclosure can factor in and compensate for these variations, especially since the LUT rate can be limited. This can be done by interpolating after the LUT correction. In addition, avoiding unnecessary re-time stages may also be important, as the re-timing process may add delay and decrease the clock recovery bandwidth.

Figure 7A:
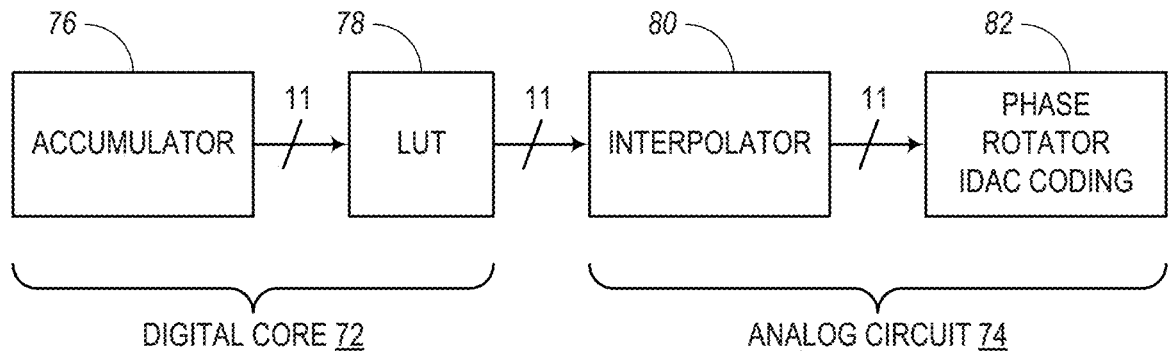
FIGS. 7A-7F are schematic diagrams illustrating circuits and systems for controlling phase rotation, according to various embodiments of the present disclosure.

FIGS. 7A-7F are schematic diagrams illustrating circuits and systems for controlling phase rotation according to various embodiments of the present disclosure. FIG. 7A shows an overall system 70 for controlling phase rotation. The system 70 includes a digital core 72 and an analog circuit 74. The digital core 72 may be part of a processor, microprocessor, or other suitable processing device having a predetermined processor clock speed. In this embodiment, the digital core 72 includes an accumulator 76 and an LUT 78 and the analog circuit 74 includes an interpolator 80 and a phase rotator Integrated Digital-to-Analog Converter (IDAC) coding device 82. In some embodiments, the phase rotator IDAC coding device 82 may be configured to provide updates that can be supplied to the LUT 78 for continuously updating the operating code of the LUT 78 for optimizing (or improving) the linearity of the phase rotation circuitry.

The accumulator 76 and LUT 78 of the digital core 72 can be calibrated through lab characterization processes. The interpolator 80 can be calibrated using updated samples. The phase rotator IDAC coding device 82 can calibrated using a background calibration process at an end location of the system 70. According to conventional systems, it had been decided that this fourth stage of background calibration (e.g., at the phase rotator IDAC coding device 82) does not have a large impact on the performance of various phase rotation systems (such as the system 70). However, according to the embodiments of the present disclosure, this background calibration at the phase rotator IDAC coding device 82 can be performed in such a way to allow for calibration that indeed can an impact on the system 70 and can optimize (or improve) the performance of the phase rotators 56a, 56b over the entire lifetime of the phase rotators 56a, 56b, even during the occurrence of different types of variations (e.g., temperature change, voltage shift, and aging effects, etc.).

According to various embodiments of the present disclosure, the interpolator 80 can be used to interpolate between cycles or samples of the clock of the digital core 72. This is an improvement over conventional designs, whereby phase rotator updates were limited to the rate of the digital core 72. This allows the analog circuit 74, configured as a macro for generating code generation, to operate at a much higher rate. As shown in FIG. 7A, 11 bits may be communicated simultaneously between each pair of components.

Increasing the update rate of the interpolator 80 can reduce the non-linearity from phase rotation processes. In one example, the strobe or clock of the digital core 72 may have a rate of one cycle or sample every 640 fs (or one cycle/sample every 768 fs). The present disclosure allows the interpolator 80 to operate at one cycle every 160 fs. According to this example, the interpolator 80 can produce a speed of 4× the digital core processor. "fs" here refers to system sampling frequency. So, for instance, if the system has a sampling frequency of 80 GHz, fs/640 is 80 GHz/640=125 MHz.

The LUT 78 is configured to operate at the digital core rate. The interpolator 80 interpolates codes linearly. After LUT conversion, however, the interpolator 80 can use a shift register to store successive values. This process can introduce a short delay path, which can be minimized by reducing re-timing stages to a minimum.

The accumulator 76 and the LUT 78 can be originally compensated for by in-lab tests, the interpolator 80 can be compensated for using a parts-based calibration, and the phase rotator IDAC coding 82 can be compensated for by background calibration. Calibration based on a Joint Calibration and Localization (JCL) process can be performed for the accumulator 76 and LUT 78. This JCL-based calibration can be performed relatively easily. Also, JCL-based calibration may also be possible with the interpolator 80 (depending on various time constraints). However, JCL-based calibration would normally not be possible on the phase rotator IDAC coding device 82 without taking it offline. The JCL-based calibration may only provide for static (initially predetermined) error correction, but it may be noted that transient effects would not be captured by this process. Thus, background calibration methods as described in the present disclosure are configured to populate the LUT 78 for utility in linearizing the phase rotation processes.

Figure 7B:
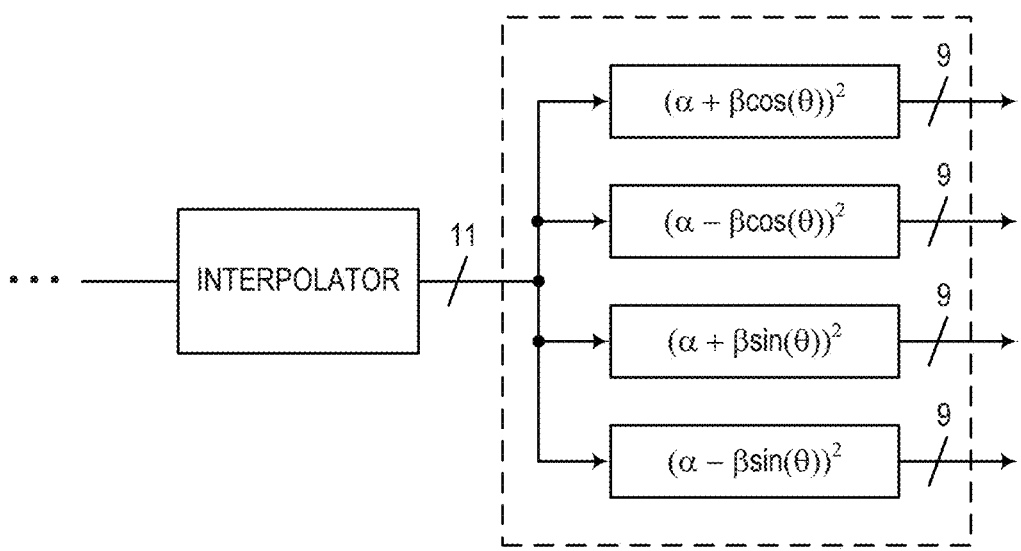

FIG. 7B illustrates an embodiment of the analog circuit 74 shown in FIG. 7A, where the analog circuit 74 includes the interpolator 80 and the phase rotator IDAC coding device 82. In this embodiment, the phase rotator IDAC coding device 82 includes first, second, third, and fourth phase rotators 86a, 86b, 86c, 86d. The first phase rotator 86a includes a phase function $(\alpha+\beta \cos(\theta))^2$; the second phase rotator 86b includes a phase function $(\alpha-\beta \cos(\theta))^2$; the third phase rotator 86c includes a phase function $(\alpha+\beta \sin(\theta))^2$; and the fourth phase rotator 86d includes a phase function $(\alpha-\beta \sin(\theta))^2$. The phase rotators 86a, 86b, 86c, 86d are configured to provide outputs to I DAC, Ib DAC, Q DAC, and Qb DAC, respectively. The phase rotator core has 4 differential pairs, each with an independent bias current. The 4 differential pairs each have different inputs and are named as such: I, Ib, Q and Qb. The codes I, Ib, Q, and Qb are the codes that are given to the current DACs that control the current bias to their respectively named differential pair. So the I code controls the current DAC for the I differential pair, and so on.

The LUT 78 may be used to correct phase errors in the phase rotator response. The phase rotator IDAC coding device 82 may be configured to populate the LUT 78 for phase rotation to compensate for various issues. For example, populating the LUT 78 according to various implementations of the present disclosure may be performed to 1) compensate for remaining non-linearities that were previously uncompensated by non-linear code. This process may also be configured to 2) compensate for global process variations. Also, the process may also 3) compensate for sample mismatches and 4) compensate for effects from voltage shifts, temperature shifts, aging, etc.

Figure 7C:
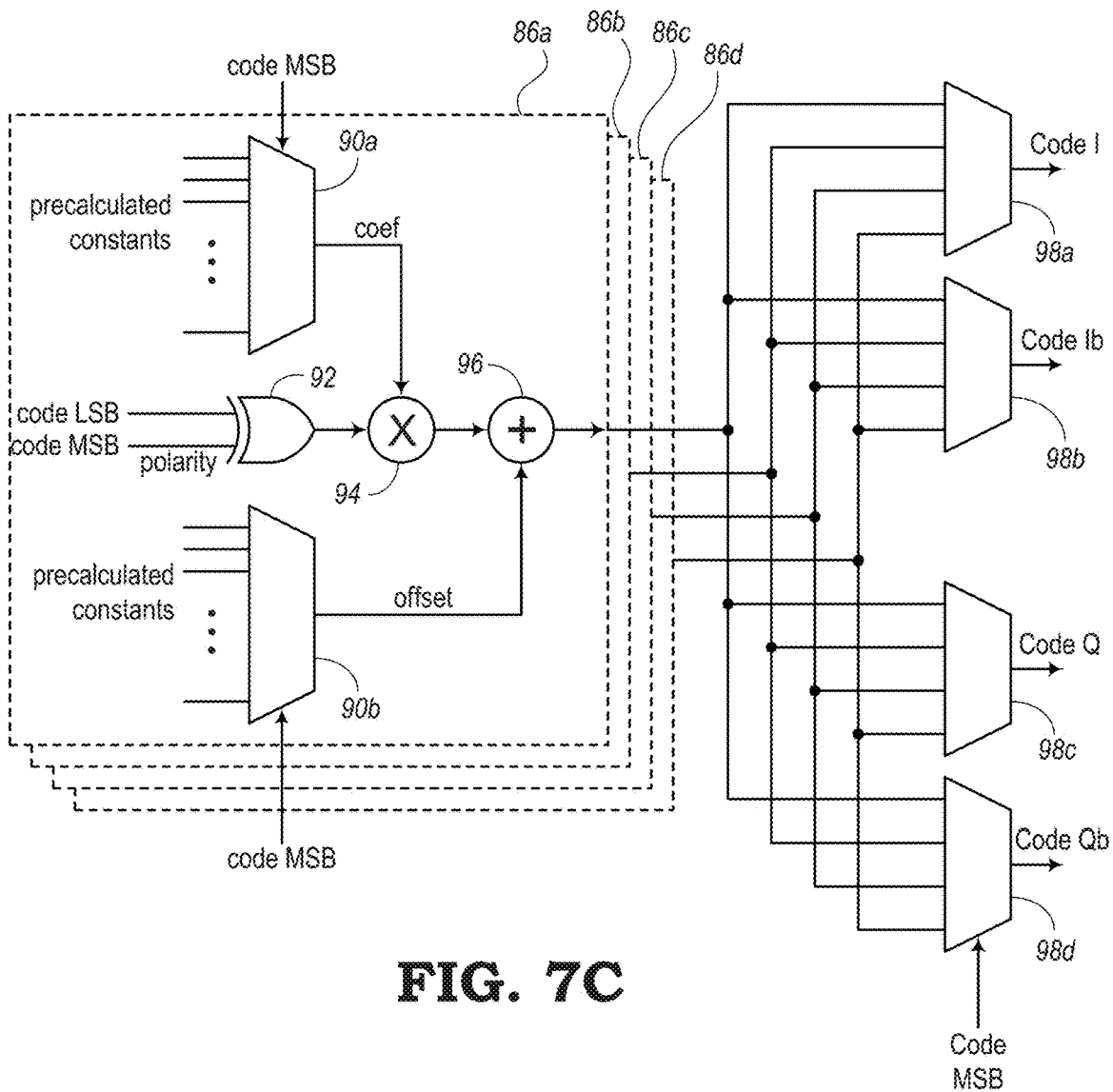

FIG. 7C is a schematic diagram illustrating an embodiment of the phase rotator IDAC coding device 82 shown in FIGS. 7A and 7B. Each of the phase rotators 86a, 86b, 86c, 86d includes first and second multiplexers 90a, 90b configured to receive a number of precalculated constants. An OR gate 92 is configured to receive a code Least Significant Bit (LSB) and a code Most Significant Bit (MSB) (representing polarity) at its inputs. An output of the OR gate 92 is supplied to a multiplier 94, which also receives a coefficient ("coef") output from the first multiplexer 90a. The output from the multiplier 94 is supplied to an adder 96, which also receives an offset output from the second multiplexer 90b.

The output of the adder 96 is also the output of the respective phase rotator (e.g., phase rotator 86a). This output, in addition to the outputs of the other adders of the other phase rotators (e.g., phase rotators 86b, 86c, 86d) are supplied to each of four different multiplexers 98a, 98b, 98c, 98d. The multiplexers 98a, 98b, 98c, 98d receive selector signal "code MSB" for selecting one of the four inputs. The first multiplexer 98a outputs Code I; the second multiplexer 98b outputs Code Ib; the third multiplexer 98c outputs Code Q; and the fourth multiplexer 98d outputs Code Qb.

Figure 7D:
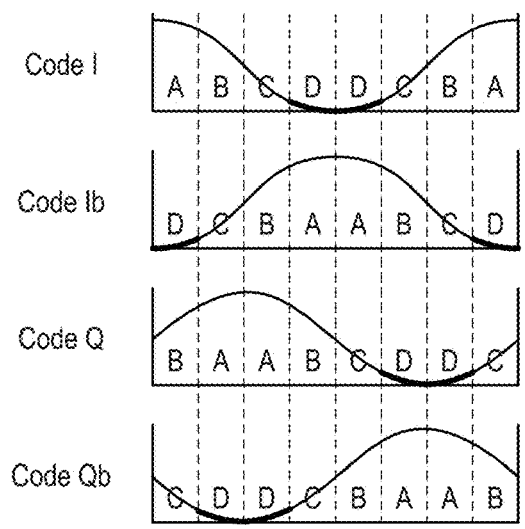

FIG. 7D is a diagram illustrating an embodiment of four phase rotations based on the outputs of the multiplexers 98a, 98b, 98c, 98d. Analog codes are provided for representing different phase rotations. For example, Code I may represent a signal with no phase rotation; Code Ib may represent a signal with a 180° phase rotation (or phase shift); Code Q may represent a signal with a 90° phase rotation (or phase shift); and Code Qb may represent a signal with a 270° phase rotation (or phase shift). The MSB portions are designated by the character "A" and the LSB portions are designated by the character "D" (highlighted in FIG. 7D).

Figure 7E:
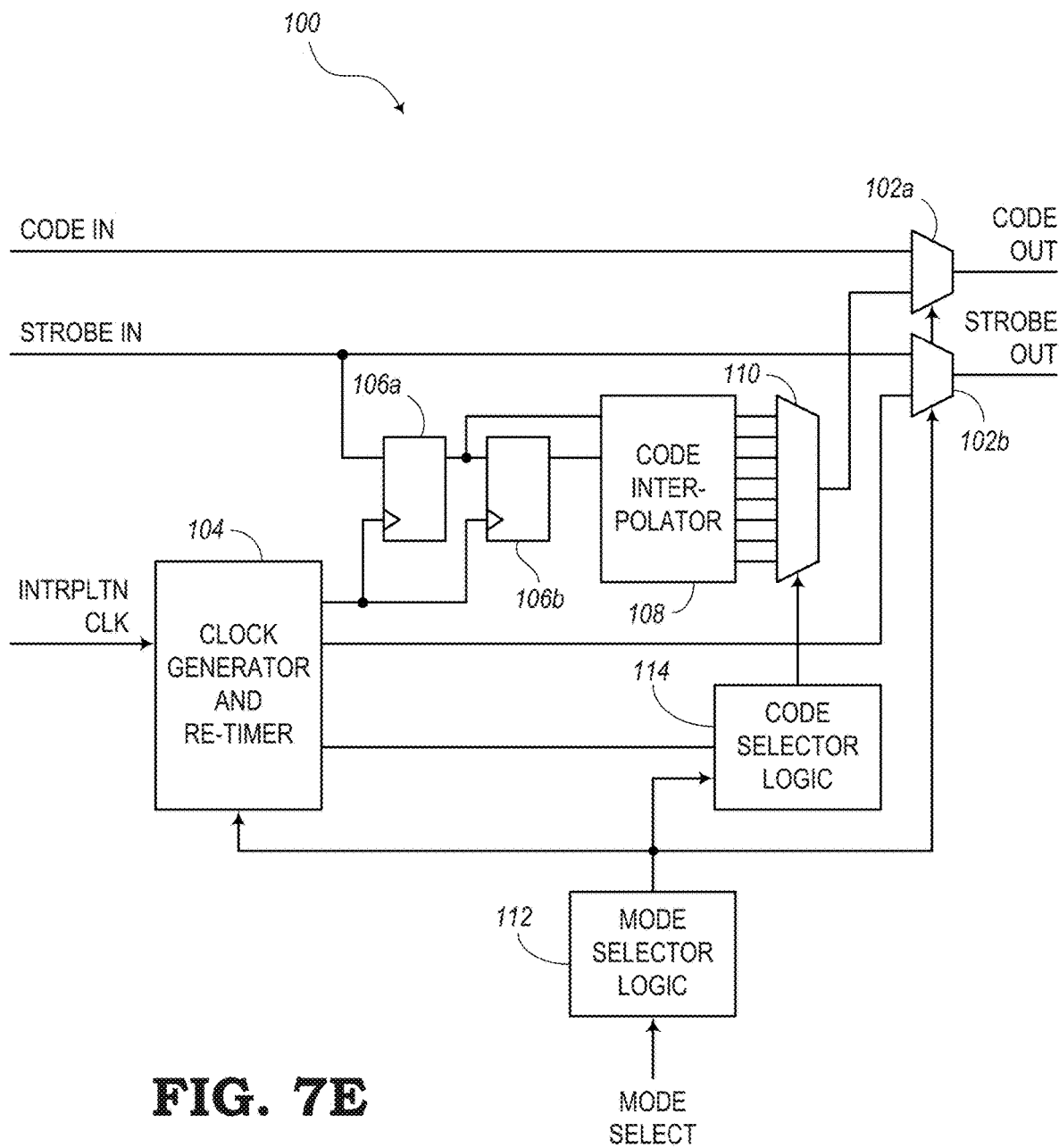

FIG. 7E is a schematic diagram illustrating an embodiment of an interpolator 100, which may represent the interpolator 80 shown in FIG. 7A. In this embodiment, the interpolator 100 includes a code input that is configured to receive CODE IN from the LUT 78 shown in FIG. 7A. The CODE IN is supplied to a first multiplexer 102a, which provides a CODE OUT signal. A strobe (clock) input is configured to receive STROBE IN from the LUT 78. The STROBE IN is supplied to a second multiplexer 102b, which provides a STROBE OUT signal.

The interpolator 100 also includes a clock generator and re-timer 104 configured to receive an interpolation clock (INTRPLTN CLK) from the LUT 78. The clock generator and re-timer 104 supplies a first output to selector inputs of first and second flip-flops 106a, 106b. A second output is supplied to the second multiplexer 102b and a third output is supplied to code selector logic 114. The first flip-flop 106a is also configured to receive the STROBE IN signal. The output of the first flip-flop 106a is supplied to the second flip-flop 106b and to an input of a code interpolator 108. The second flip-flop 106b also supplies an output to the code interpolator 108. The code interpolator 108 may be configured to provide eight outputs to another multiplexer 110. Mode selector logic 112 is configured to receive a mode select input and provide mode selections to each of the multiplexers 102a, 102b, the clock generator and re-timer 104, and the code selector logic 114. The code selector logic 114 is configured to select one of the inputs to the multiplexer 110 for output to the first multiplexer 102a.

Figure 7F:
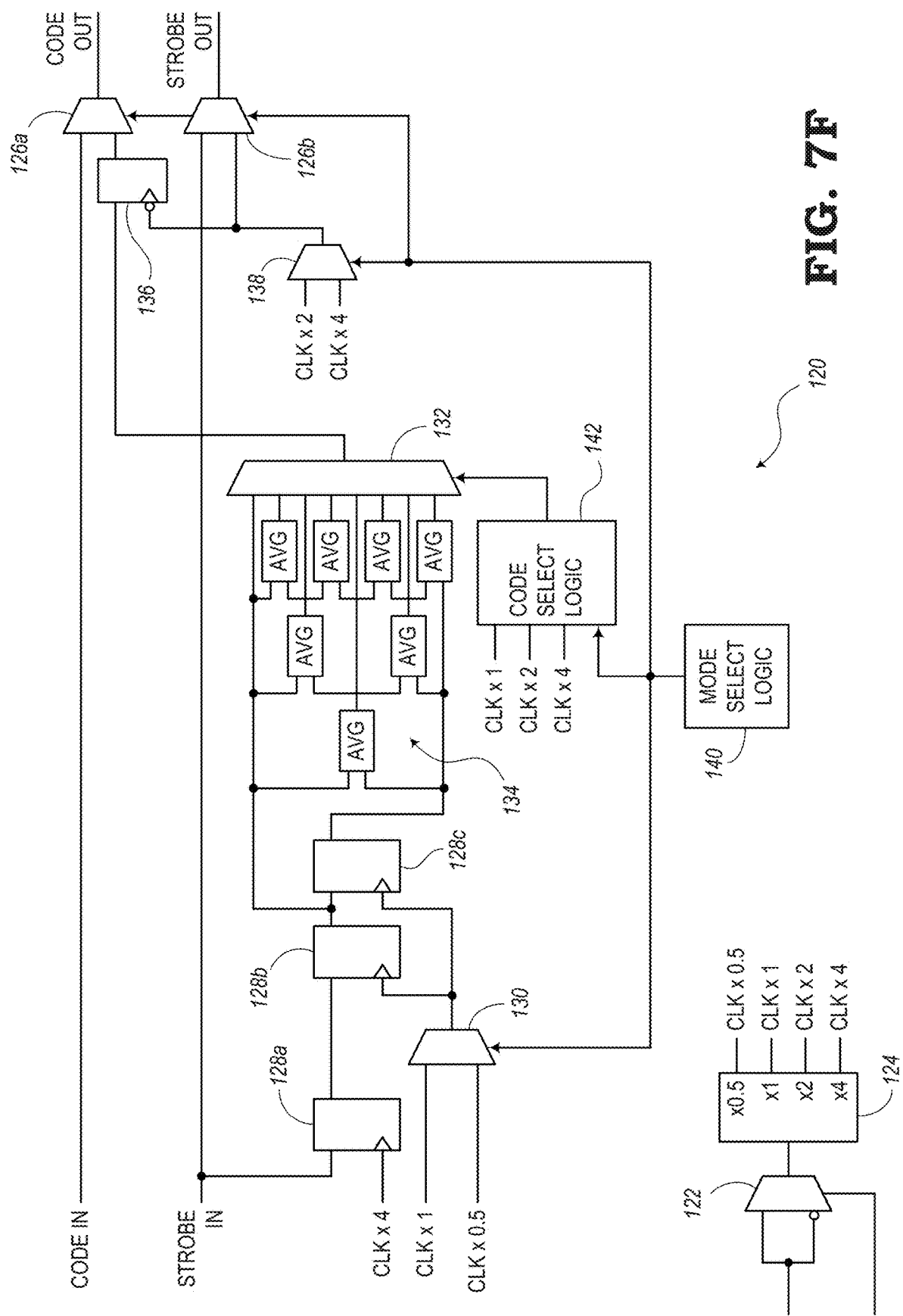

FIG. 7F is a schematic diagram illustrating another embodiment of an interpolator 120, which may also represent the interpolator 80 shown in FIG. 7A. In this embodiment, the interpolator 120 includes a multiplexer 122 for receiving, from the LUT 78, a clock signal from the digital core 72 and an inverse of the digital core clock signal at its inputs. The multiplexer 122 provides an output to logic 124 configured to output four different clock signals. A first clock signal is the digital core clock signal×0.5 (CLK×0.5); a second clock signal is the digital core clock signal×1 (CLK×1); a third clock signal is the digital core clock signal×2 (CLK×2); and the fourth clock signal is the digital core clock signal×4 (CLK×4). These clock signals may be provided to various components of the interpolator 120.

First and second multiplexers 126a, 126b are configured to receive CODE IN and STROBE IN signals, respectively. A first flip-flop 128a receives the STROBE IN signal and the CLK×4 as a selector input. The first flip-flop 128a provides an output to a second flip-flop 128b, which provides an output to a third flip-flop 128c. Another multiplexer 130 receives the CLK×1 and CLK×0.5 clock signals and provides an output to the selector inputs of the second and third flip-flops 128b, 128c. The output of the second flip-flop 128b is supplied as an input to a multiplexer 132. A number of averaging circuits 134 are arranged between this output of the second flip-flop 128b and an output of the third flip-flop 128c to provide multiple outputs to the multiplexer 132.

The output of the multiplexer 132 is supplied to another flip-flop 136. A multiplexer 138 receives CLK×2 and CLK×4 inputs and supplies an output to a selector input of the flip-flop 136 and to another input of the second multiplexer 126b. The output of the flip-flop 136 is supplied to another input of the first multiplexer 126a. Mode selector logic 140 is configured to receive a mode selection signal and provide a mode selection output to each of the first and second multiplexers 126a, 126b, the multiplexers 130 and 138, and code select logic 142. The code select logic receives the CLK×1, CLK×2, and CLK×4 clock signals and provides the selected output to a selector input of the multiplexer 132.

At any given time, one of each code blocks may be used. This can provide significant improvement over piecewise linear code block compared with other systems. Using the interpolators 100, 120 described in the present disclosure, the system 70 is configured to compensate for sub-threshold region operation. These may be configured to as an improvement, whereby other system may operate at the expense of slightly higher power and a reduction in gain. The system 70 of the present disclosure may be configured resolve linearity issues by making adjustments in the tuning and by sizing the interpolators 100, 120 appropriately.

Figure 8:
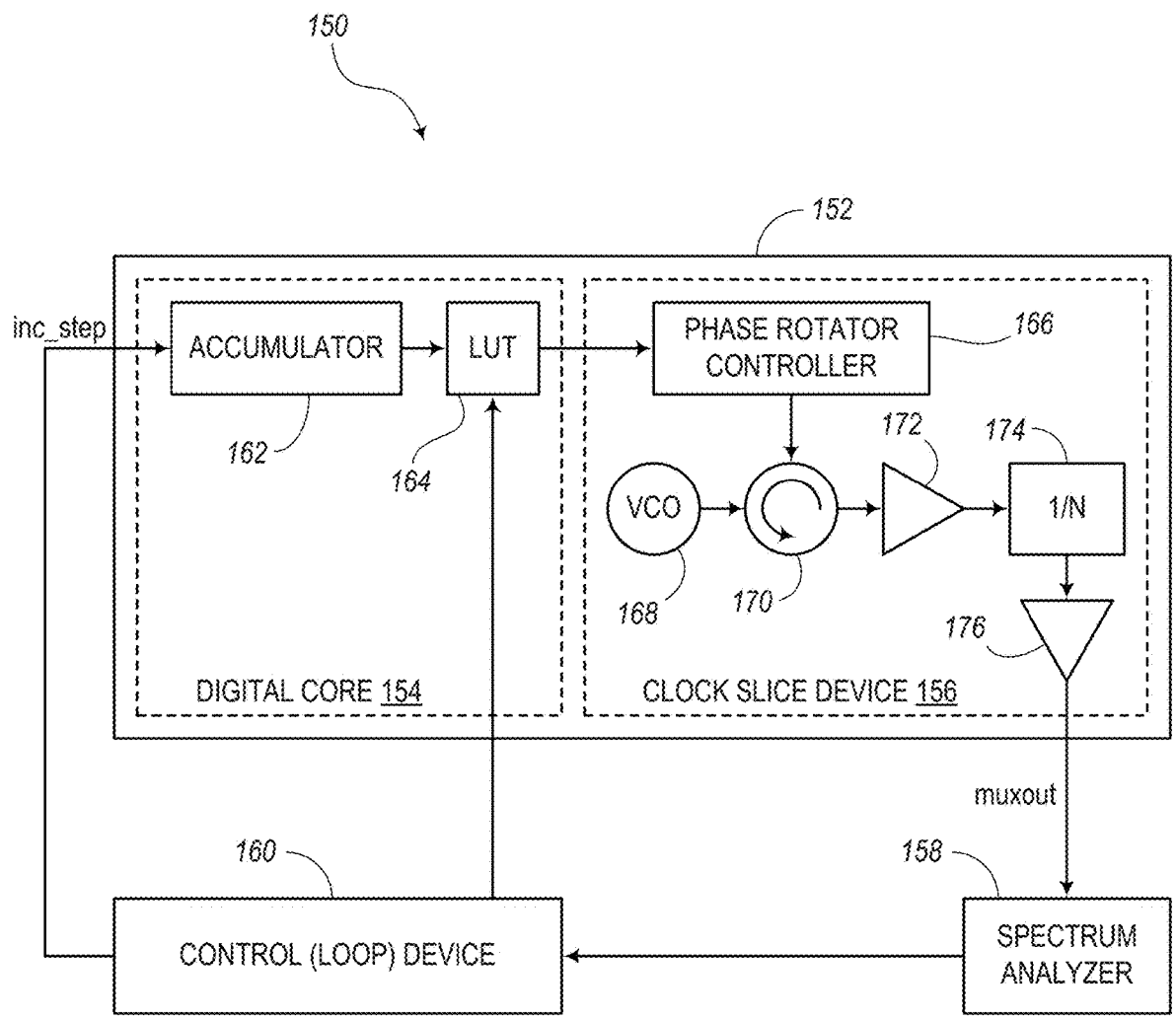
FIG. 8 is a schematic diagram illustrating another system for controlling phase rotation, according to various embodiments of the present disclosure.

FIG. 8 is a schematic diagram illustrating an embodiment of a control system 150 for controlling phase rotation. In this embodiment, the system 150 may include a phase rotation system 152 (e.g., the system 70 described above with respect to FIGS. 7A-7F). For example, the phase rotation system 152 may include a digital core 154 (e.g., the digital core 72) and a clock slice device 156 (e.g., the analog circuit 74). Also, the control system 150, according to this embodiment, includes a spectrum analyzer 158 and a control device 160 (e.g., a control loop) used in a feedback loop configuration for providing linearization control of phase rotation devices.

In some embodiments, the digital core 154 may include an accumulator 162 (e.g., the accumulator 76 shown in FIG. 7A) and an LUT 164 (e.g., the LUT 78). The clock slice device 156 may include a phase rotator controller 166, a Voltage-Controlled Oscillator (VCO) 168, a phase rotator 170, an amplifier 172, a frequency divider (1/N) 174, and a second amplifier 176. The output of the second amplifier 176 is provided as a multiplexer output to the spectrum analyzer 158. In response to phase rotation characteristics obtained by the spectrum analyzer 158, the control device 160 is configured to update the LUT 164 as needed to optimizer (or improve) the operational code stored in the LUT 164 for creating a linearized phase rotator response. Also, the control device 160 is configured to provide an incremental step (inc_step) to the accumulator 162.

The control system 150 is arranged with the measurement setup as shown in FIG. 8 and may be configured to operate without Joint Calibration and Localization (JCL) phase rotator calibration hardware. Instead, the control system 150 may include a useful testbed for calibration testing by monitoring the integrated jitter and use the jitter to guide adjustments to the LUT 164. Simulation results showing the input code and input clock signals provided to the interpolator (e.g., clock slice device 156) and the output code and output clock signals supplied by the interpolator are shown with respect to FIGS. 10A-10D, as described in more detail below.

Figure 9:
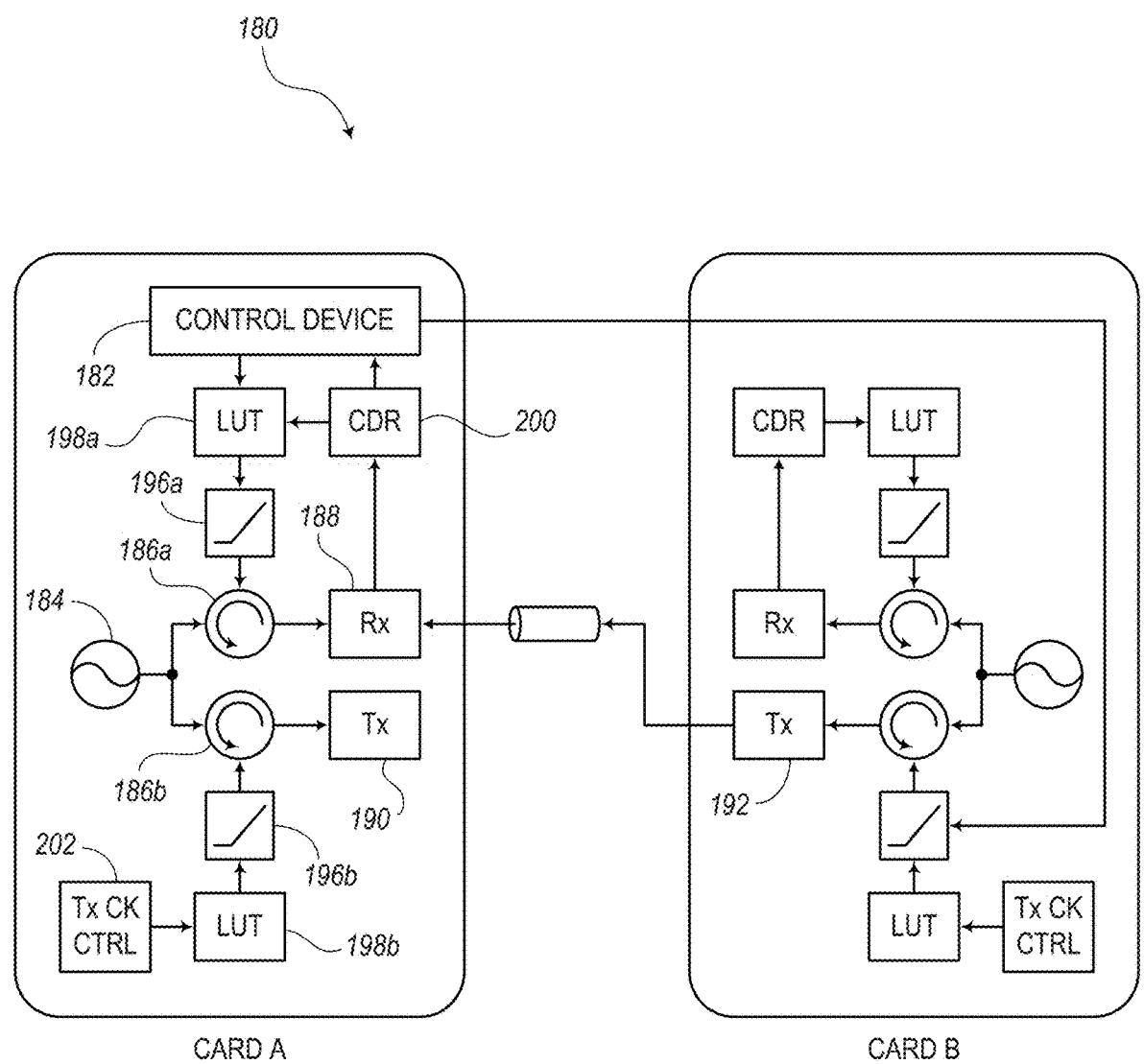
FIG. 9 is a schematic diagram illustrating yet another system for controlling phase rotation, according to various embodiments of the present disclosure.

FIG. 9 is a schematic diagram illustrating an embodiment of another control system 180 for controlling phase rotation. The control system 180 may include the setup shown in FIG. 9 for conducting background calibration. In this embodiment, the control system 180 includes Card A and Card B. According to other embodiments, the control system 180 may be configured to any two separate components of a system where phase rotation can be performed for two or more components with a single Phase-Locked Loop (PLL).

As shown, the control system 180 includes a control device 182 (e.g., control loop) used in a feedback loop control configuration for providing control to both Card A and Card B. Card A includes an oscillator 184 (e.g., VCO) representing an output of a PLL. Card A also includes first and second phase rotators 186a, 186b connected to the oscillator 184 and outside of the feedback loop of the associated PLL. In this embodiment, a Rx component 188 is arranged to receive the phase rotation output from the first phase rotator 186a and a Tx component 190 is arranged to receive the phase rotation output from the second phase rotator 186b. Card B include similar components. A Tx component 192 of Card B is configured to communicate data signals to the Rx component 188 of Card A along link 194.

The phase rotators 186a, 186b of Card A are configured to receive linear ramp signals from linear ramp devices 196a, 196b, respectively. LUTs 198a, 198b are configured to supply operating code to the linear ramp devices 196a, 196b, respectively, for controlling the operation and linearity of the linear ramp devices 196a, 196b. The first LUT 198a is configured to receive control signals from the control device 182 and from a Clock and Data Recovery (CDR) device 200. The CDR device 200 is also configured to receive phase response input from the Rx component 188 and provide signals indicative of the received phase response to the control device 182 for further analysis to enable recovery of clock and data signals. On the Tx side of Card A, the second LUT 198b is configured to receive clock signals from a Tx CLK control device 202. Again, Card B includes a similar Tx CLK control device.

The Rx component 188, CDR device 200, LUT 198a, linear ramp device 196a, and phase rotator 186a form a feedback control loop for actively updating the LUT 198b to optimize the linearity of the linear ramp device 196a and phase rotator 186a. Card B includes similar components and a similar feedback control loop with its Rx component. Another feedback loop involves the control device 182 that supplies control to the LUT 198b and the associated LUT of Card B.

The CDR 200 in the receiver loop is able to estimate and monitor the total clock jitter in the Tx and Rx paths. Trial adjustments in either the Rx LUT (e.g., LUT 198a) or the Tx LUT (e.g., LUT 198b) can be made and the total jitter monitored. Adjustments to the LUT 198a, 198b are made as needed. Since the jitter created by a small trial offset in the wrong direction is very small (e.g., approximately on the order of a few femtoseconds (fs)), the impact on the control system 180 is small. Long averages can be used in order to resolve these small differences. Over a long period of time, the LUTs 198a, 198b can be improved and slow effects, such as temperature or voltage drifts, aging effects, etc. can be compensated for.

In operation, the control system 180 is configured to use the same control loop as used in other embodiments. However, according to some implementations, jitter may be measured using information from the CDR 200 regarding an amount of jitter. It is likely that only the LUT 198a associated with the Rx loop needs to be modified (for simplicity). However, in some other embodiments, the control system 180 may be modified to potentially provide enhanced performance which may be possible by incorporating a CDR device with the Tx in another feedback loop to enable the modification of the LUT 198b associated with the Tx side.

As the LUT 198a approaches an "ideal" value, the jitter issues (e.g., integrated spurs and phase noise) will improve. It may be noted that this arrangement might not be applicable on a single isolated point basis. For example, if a phase jump between consecutive points is too large, it may cause a phase jump that leads to spurs and increased jitter. In this case, it may be possible to use a search having smaller incremental steps over a larger range of LUT values so as to avoid any sudden jumps.

Figure 10A:
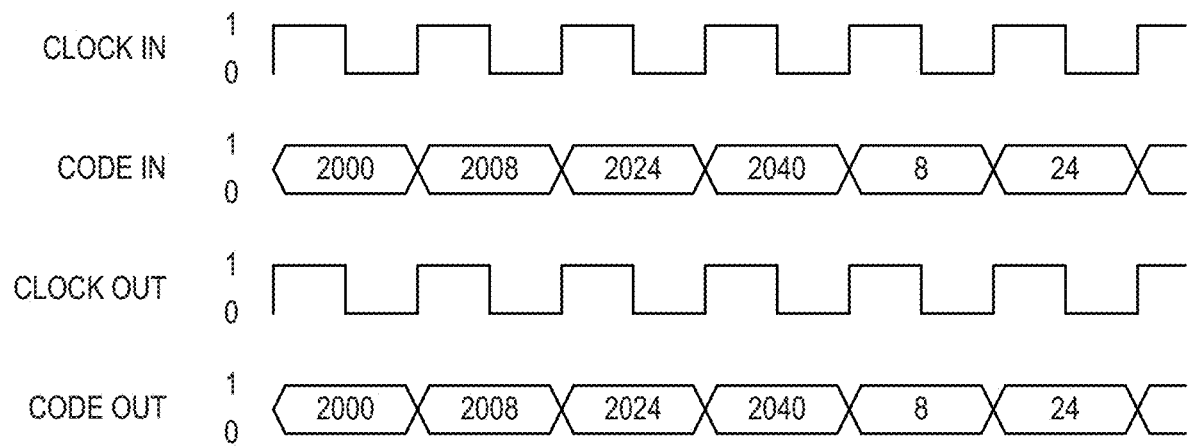
FIGS. 10A-10D are diagrams illustrating timing and coding signals with respect to an interpolator of a phase rotation controller, according to various embodiments of the present disclosure.
Figure 10B:
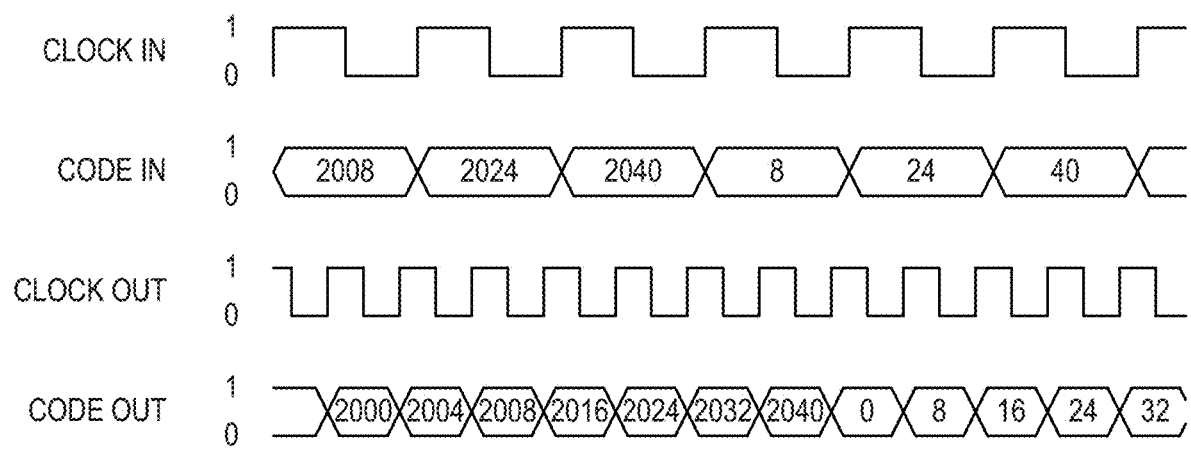
Figure 10C:
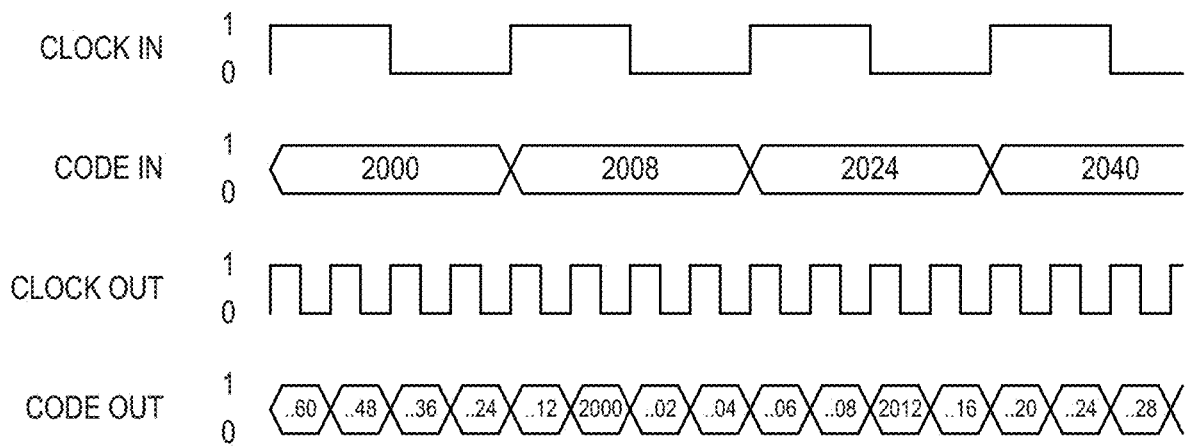
Figure 10D:
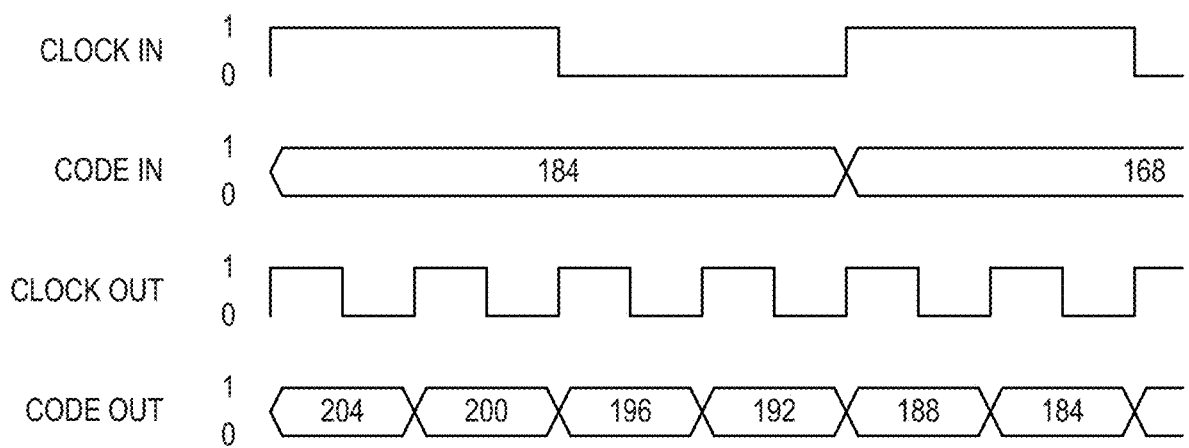
Figure 11A:
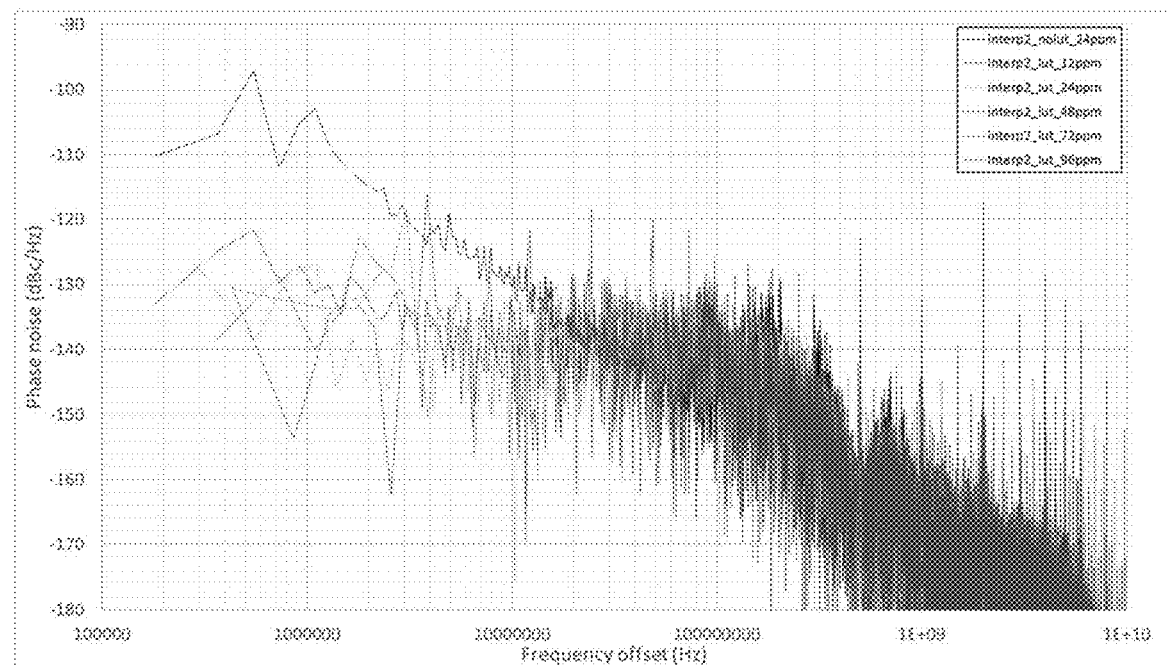
FIGS. 11A-11J are graphs showing phase noise simulation results using various interpolation modes, according to various embodiments of the present disclosure.
Figure 11B:
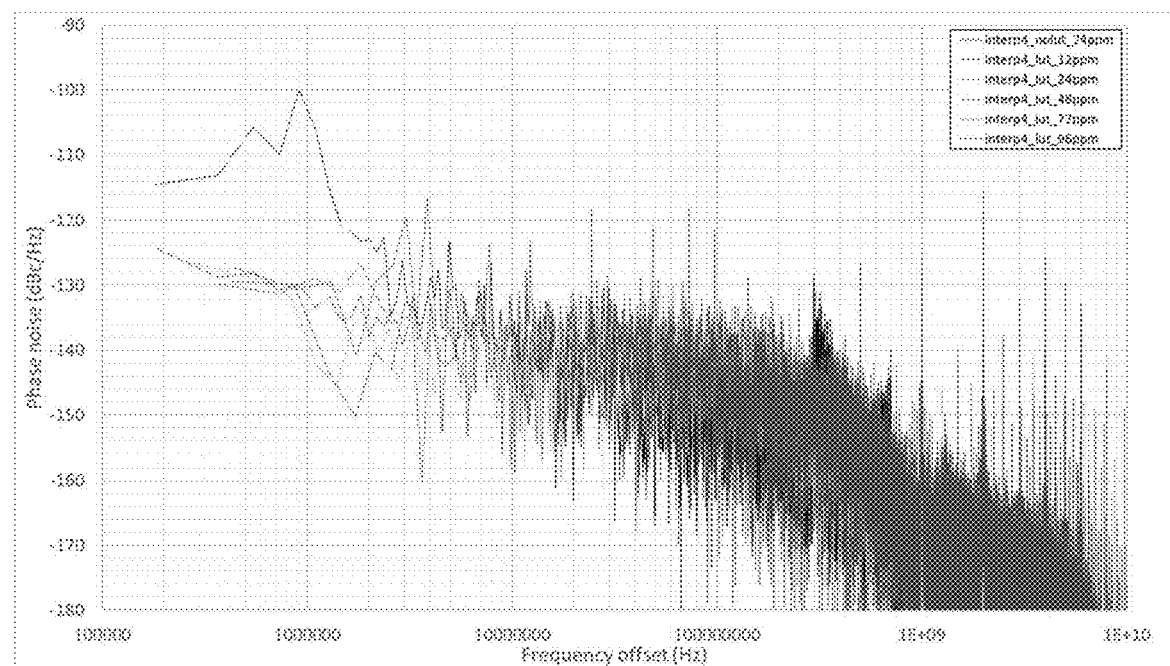
Figure 11C:
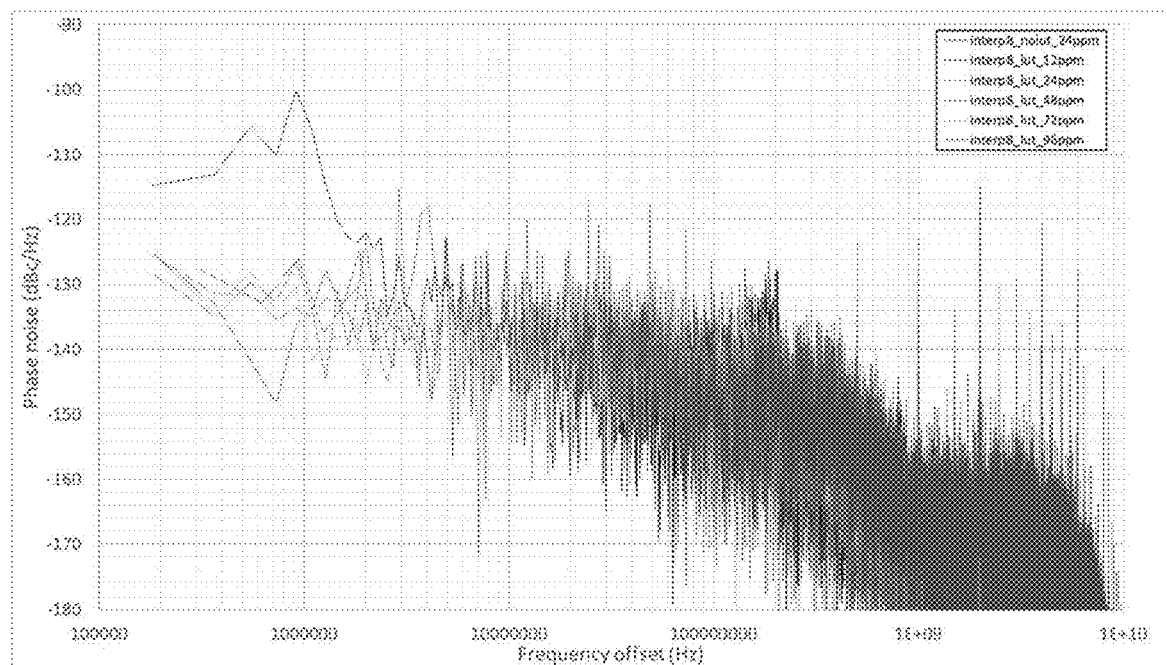
Figure 11D:
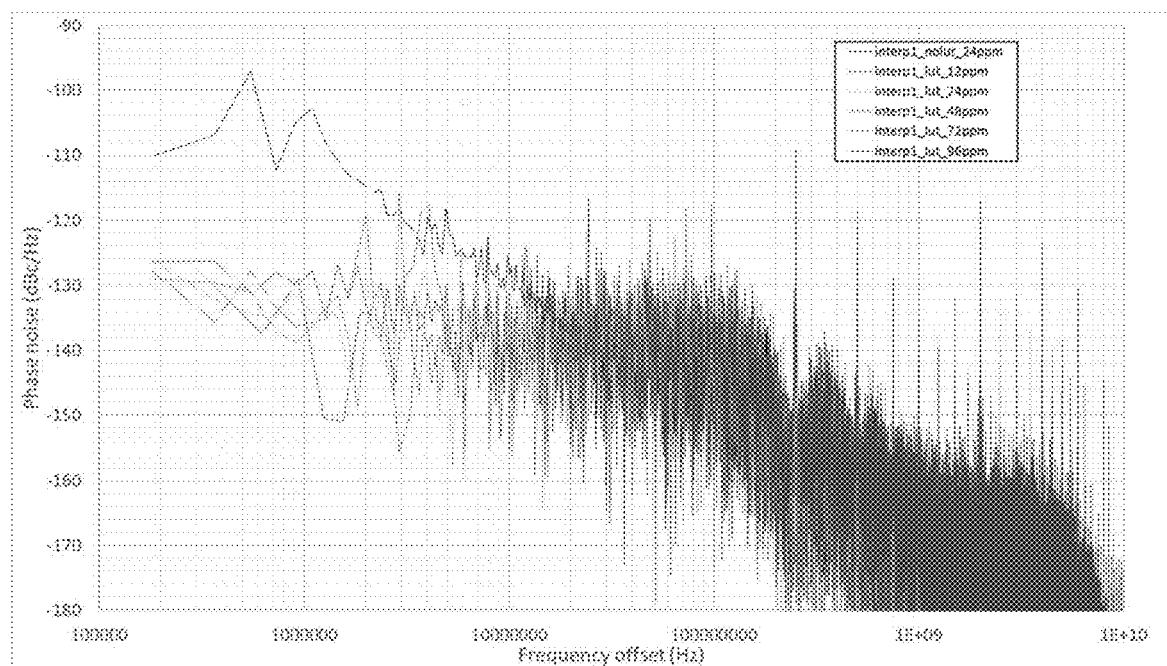
Figure 11E:
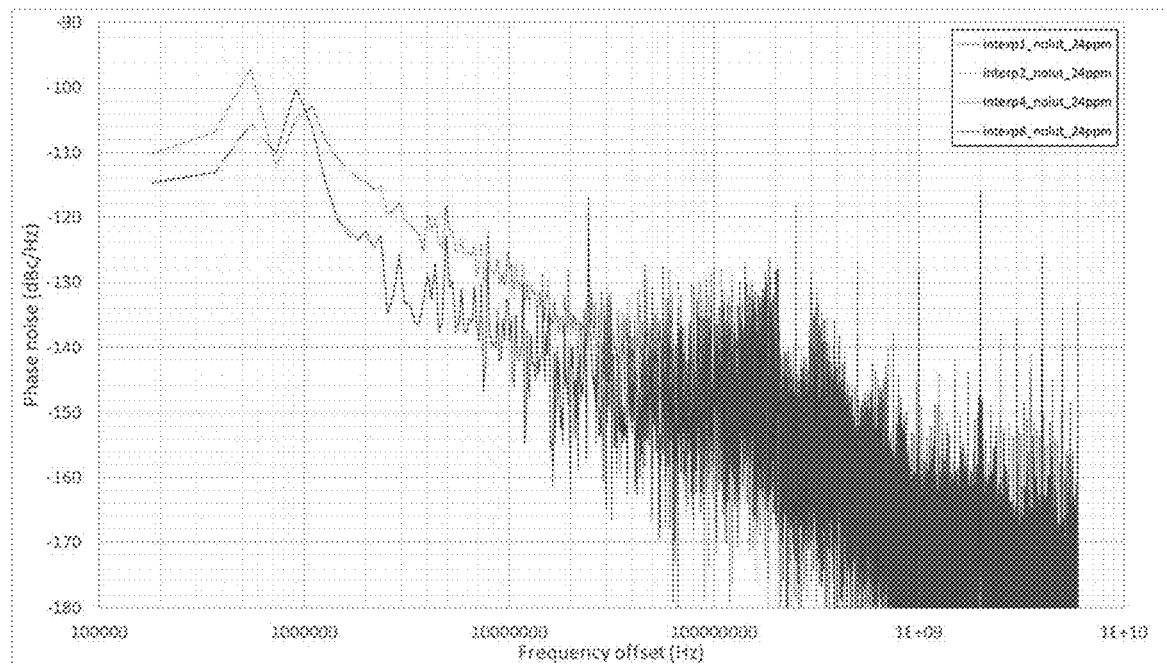
Figure 11F:
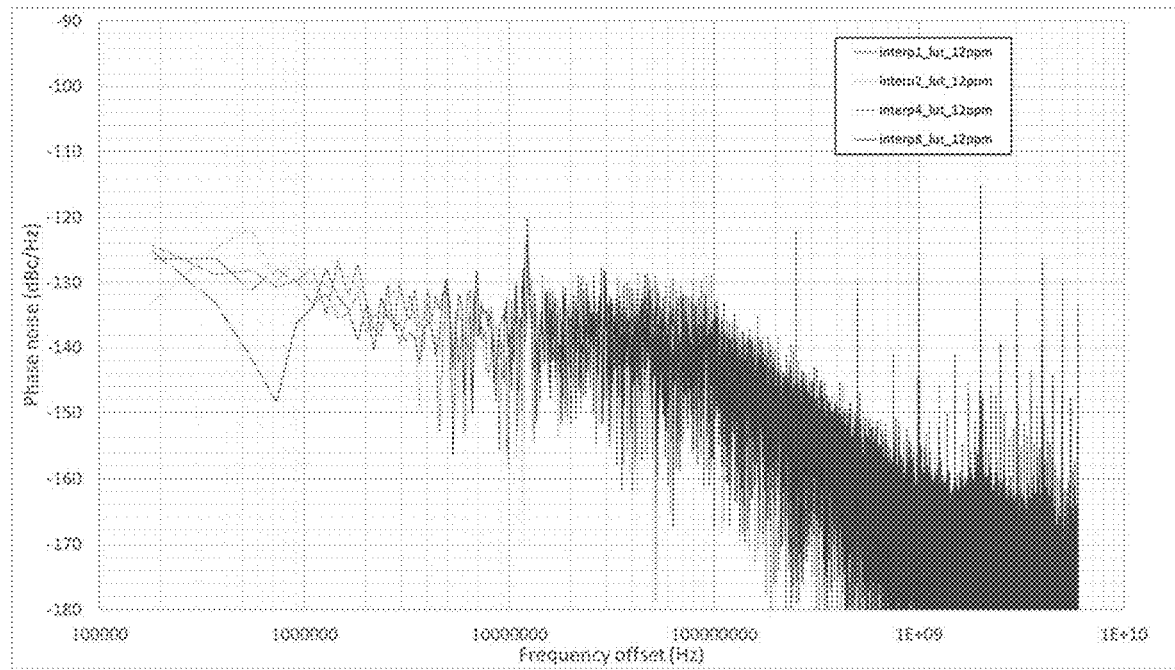
Figure 11G:
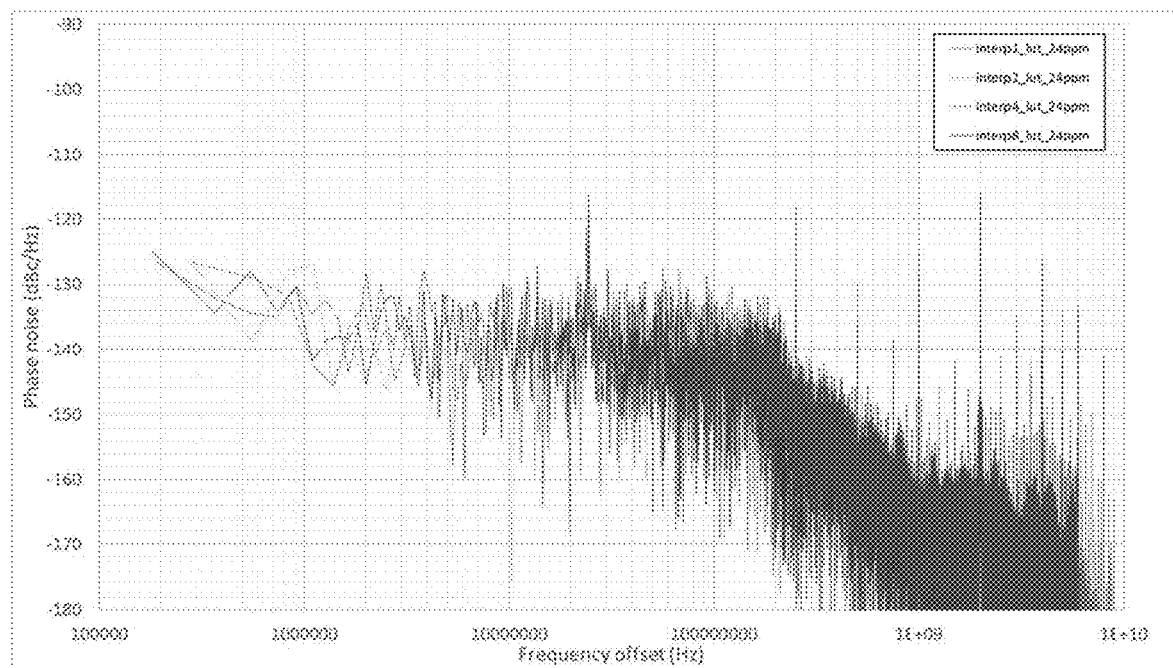
Figure 11H:
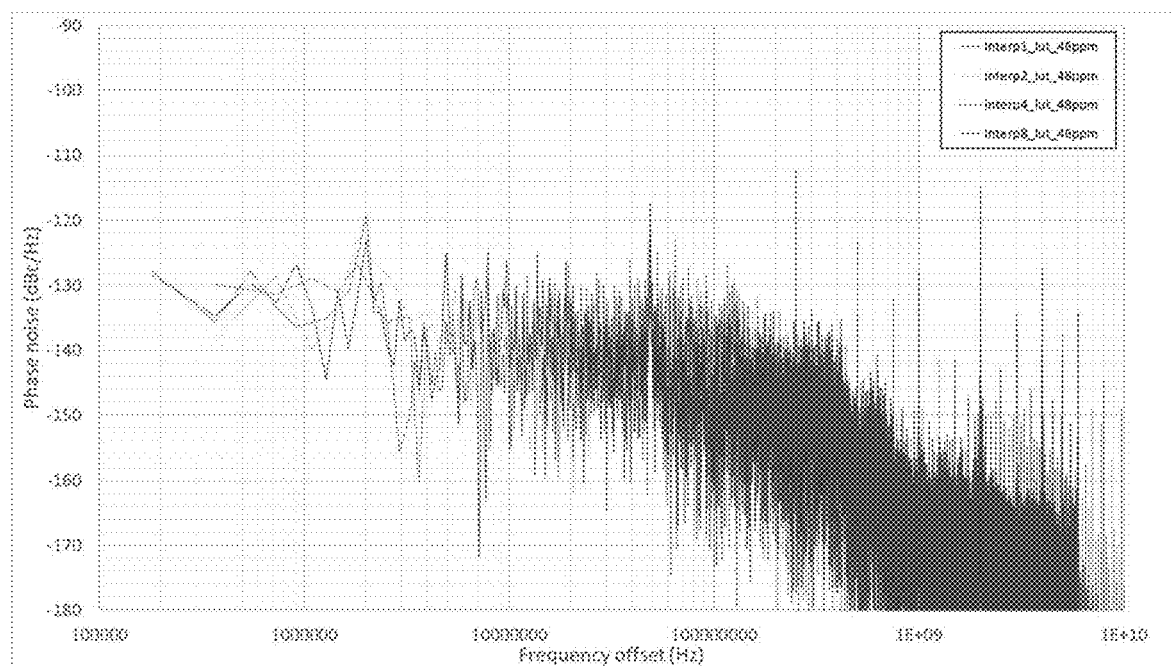
Figure 11I:
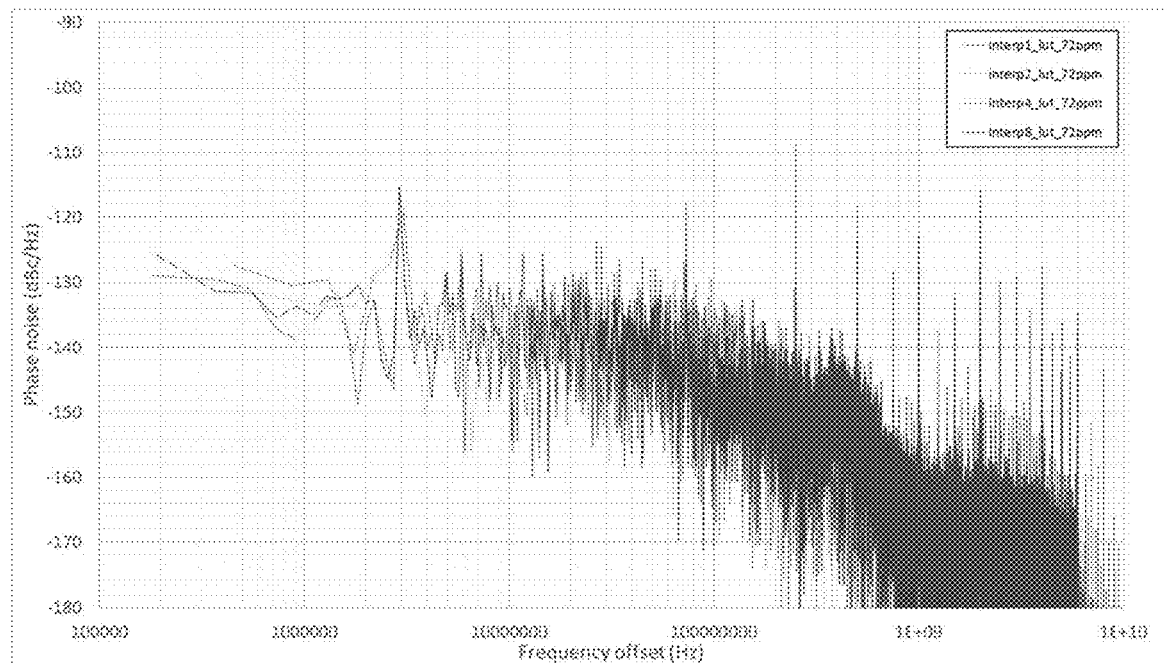
Figure 11J:
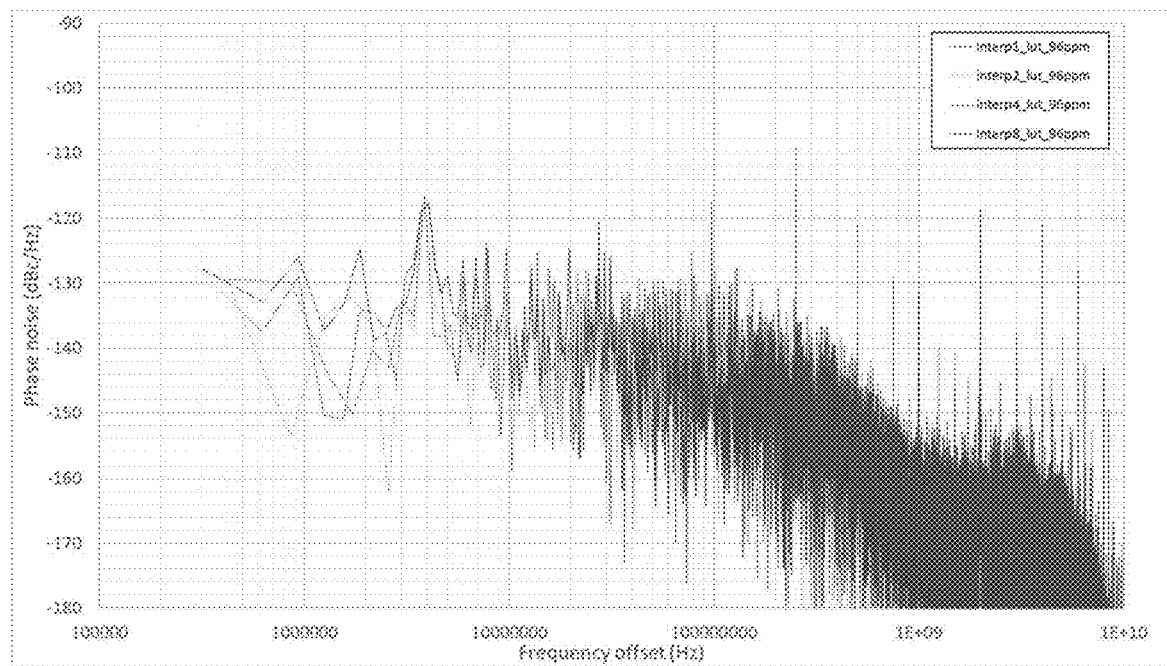

FIGS. 10A-10D are diagrams illustrating timing and coding signals with respect to an interpolator (e.g., interpolator 80, 100, 120) of a phase rotation controller (e.g., control systems 150, 180). FIG. 10A represents the timing and coding signals associated with Mode 00; FIG. 10B represents the timing and coding signals associated with Mode 01; FIG. 10C represents the timing and coding signals associated with Mode 10; and FIG. 10D represents the timing and coding signals associated with Mode 11.

In Mode 00 (no interpolation), the CLK IN and CLK OUT signals are the same and are not modified. Also, the CODE IN and CODE OUT signals are the same. In Mode 01 (CLK×2), the CLK IN is multiplied by 2 to arrive at the CLK OUT rate. Also, as is shown in FIG. 10B, the CODE OUT signal includes twice as much granularity. In this respect, the CLK OUT includes interpolation (averaging) between the values (e.g., the average of values 2024 and 2040 in the CODE IN provides a value of 2032 in the intermediate clock signal on the CODE OUT). Similarly, Mode 10 (CLK×4) includes a CLK IN that is multiplied by 4 to arrive at the CLK OUT rate and the CODE OUT includes four times the granularity. In Mode 11 (CLK×8 at half the clock rate), the CLK OUT is equal to the CLK IN times 4, plus every other code in the CODE OUT is skipped to provide eight time the granularity.

These simulation results show the phase error for a rotated output of the phase rotator at an offset of 96 parts per million (ppm) (e.g., used to calculate jitter) with all four interpolator modes exercised. The LUT is already populated and greatly reduces jitter from the phase rotator from 100-130 fs. The active interpolators of Modes 01, 10, and 11 (e.g., ×2, ×4, ×8) significantly improve the phase for higher offset values. This allows the performance at high offsets to be similar to that of lower offset values.

Also, FIGS. 10A-10D show interpolator improvements. Automatic or semi-automatic phase selection may include using a phase detector to determine relative phase between interpolation clock and strobe. Variable interpolation clock divider and strobe clock divider can be used to match different modes. Alternatively, the control systems (e.g., control systems 150, 180) can use different averaging blocks to create 3× or 5× interpolation in some cases. In addition, other interpolator improvement may include the ability to sample on the rising and falling edges to further increase rates by twofold (e.g., in Mode 11).

Simulation results for phase rotation may include an extracted model of an entire clock generation core and current DACs (with an EM model for inductors). Schematic logic for phase rotator controllers may include long transient simulation with ramped input code to create different PPM offset. The phase rotator may have a clock of 250 MHz, rather than 125 MHz (e.g., sampling frequency of 640 samples per picosecond (ps)) or 104 MHz (e.g., sampling frequency of 768 samples per ps) clock used in some phase rotators. In some cases, a 24 ppm run may be conducted without LUT calibration for measuring jitter. The detected phase errors can be used to populate the LUT. Then, 12 ppm, 24 ppm, 48 ppm, 72 ppm, and 96 ppm offsets can be run. Then, the interpolations modes can be run.

Figure 12A:
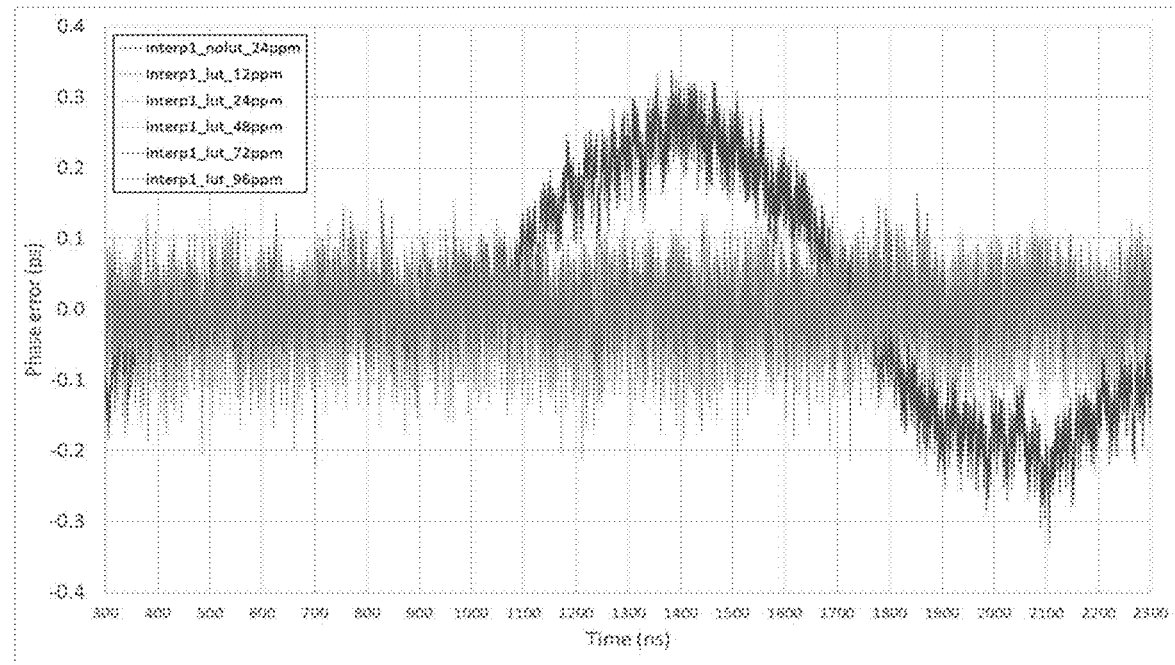
FIGS. 12A-12N are graphs showing phase error simulation results using various interpolation modes, according to various embodiments of the present disclosure.
Figure 12B:
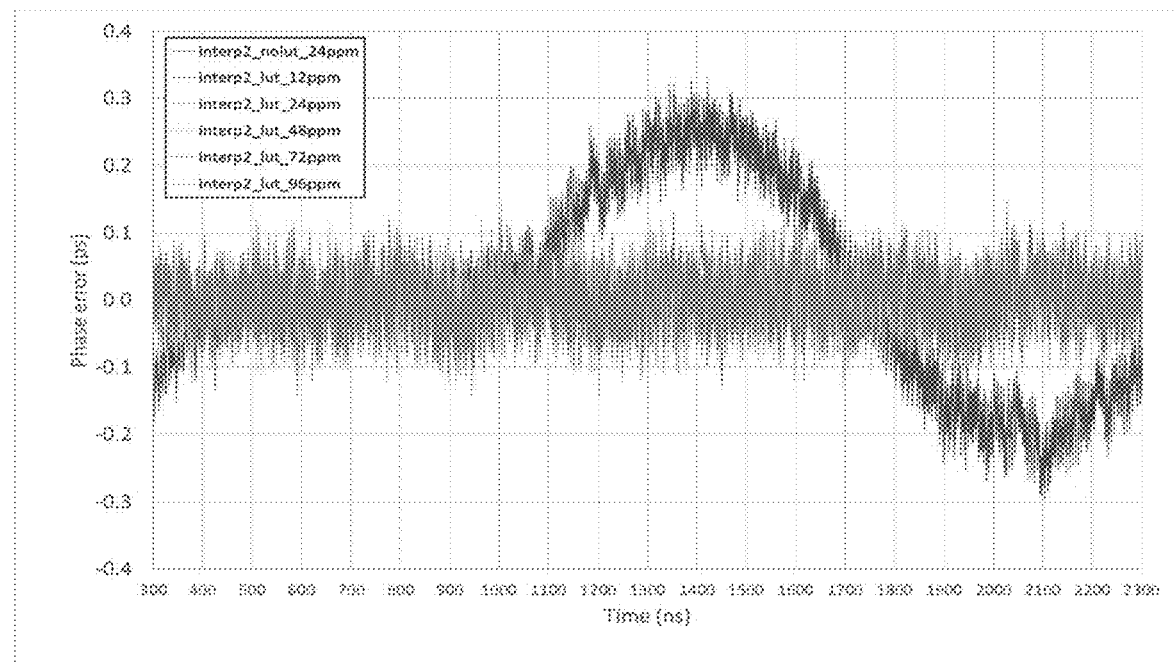
Figure 12C:
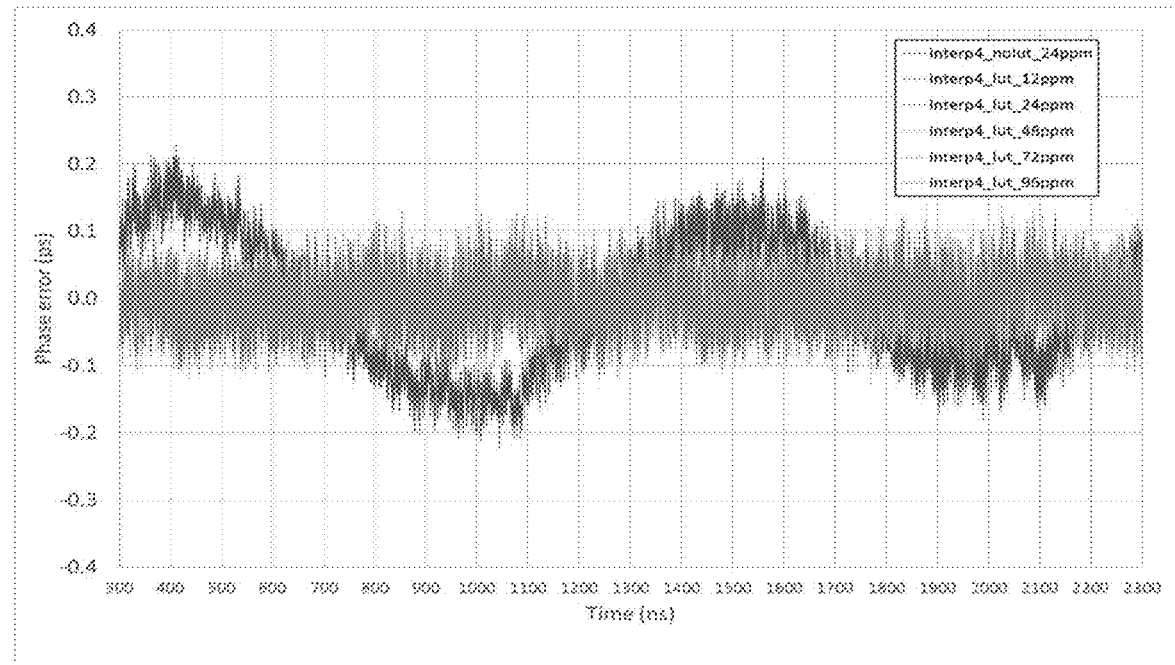
Figure 12D:
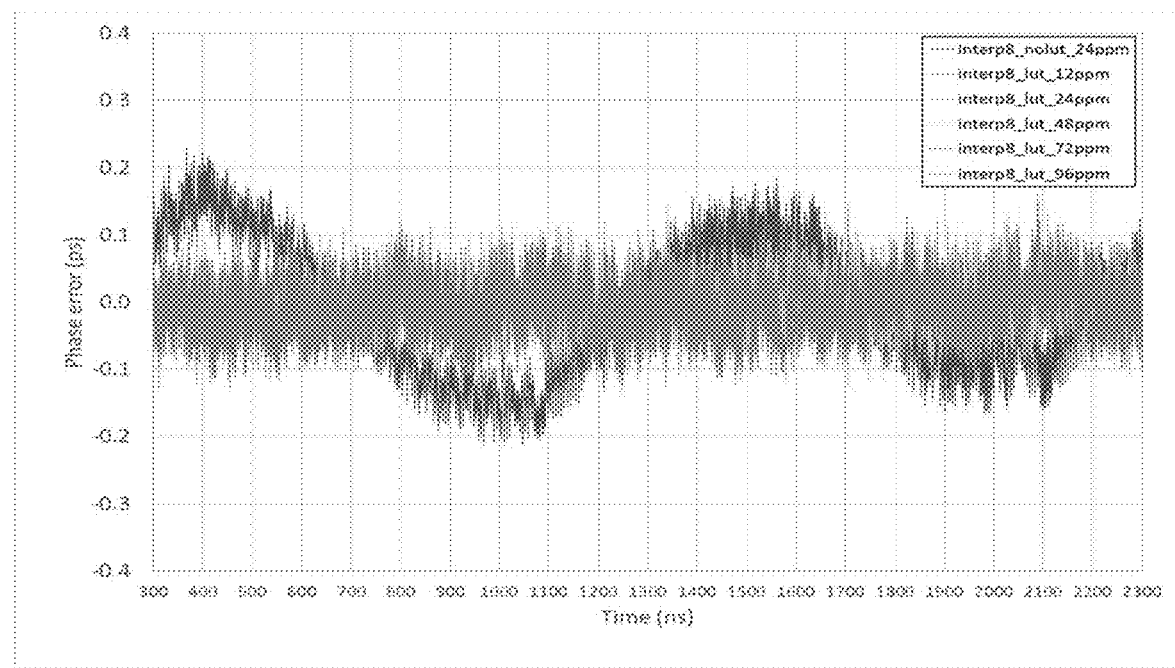
Figure 12E:
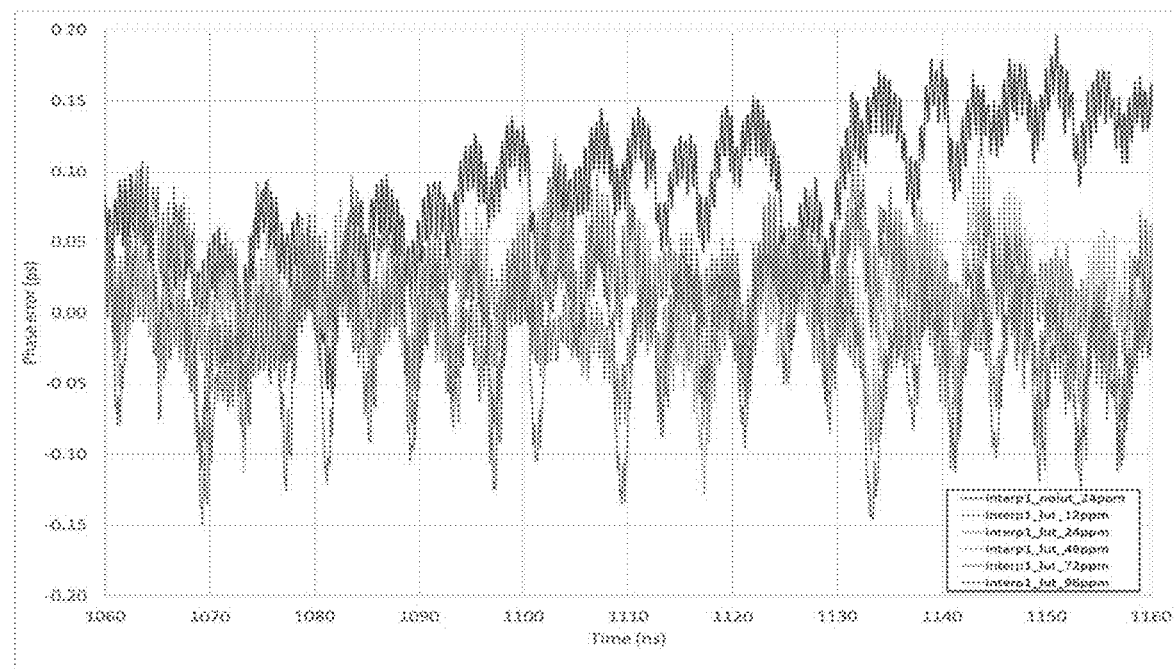
Figure 12F:
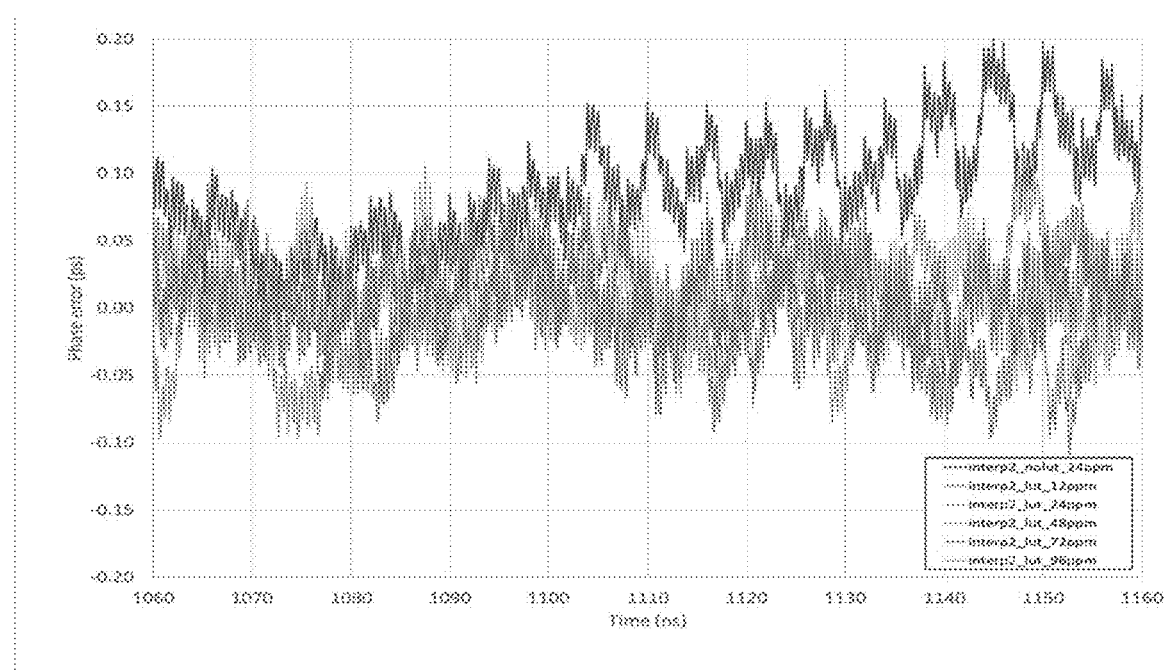
Figure 12G:
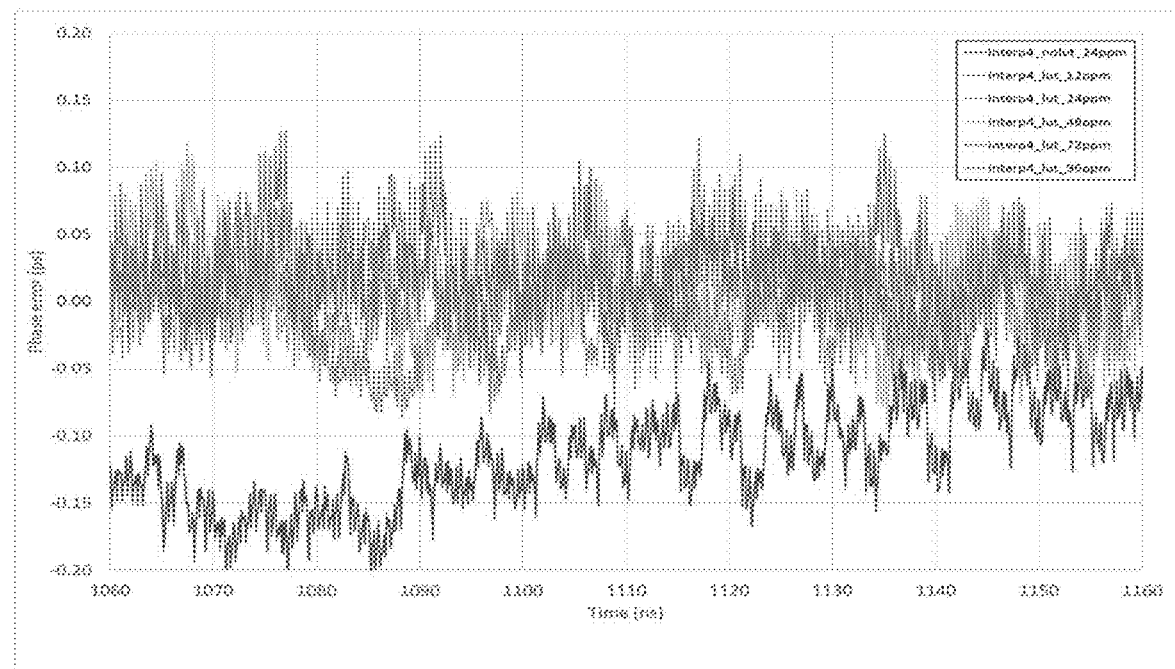
Figure 12H:
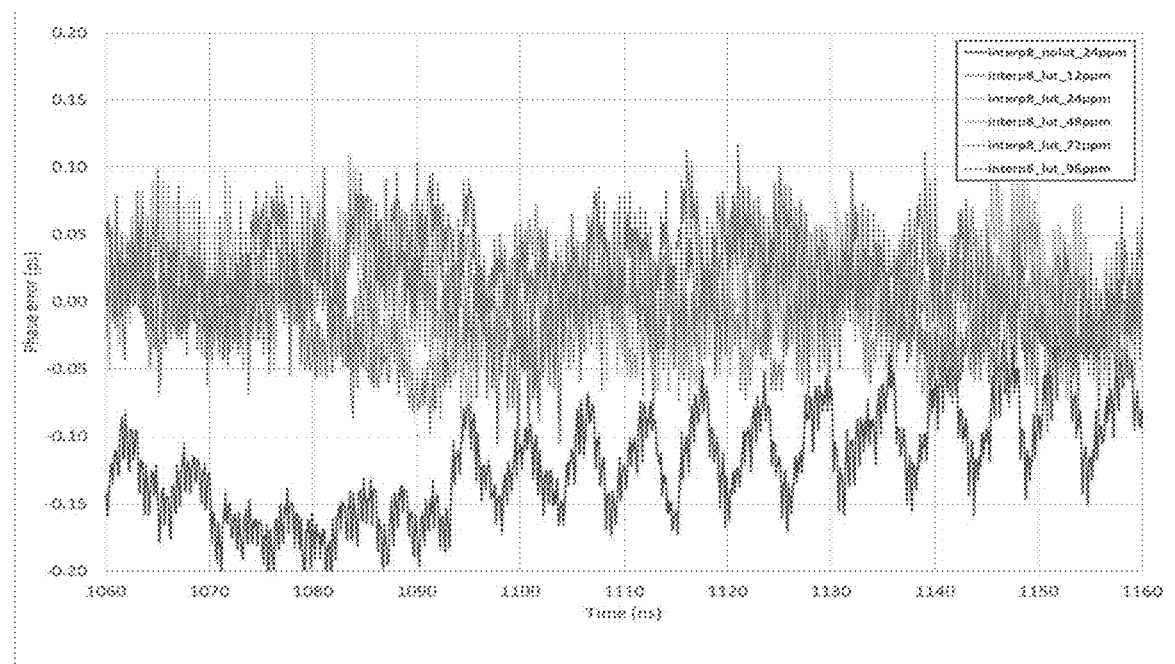
Figure 12I:
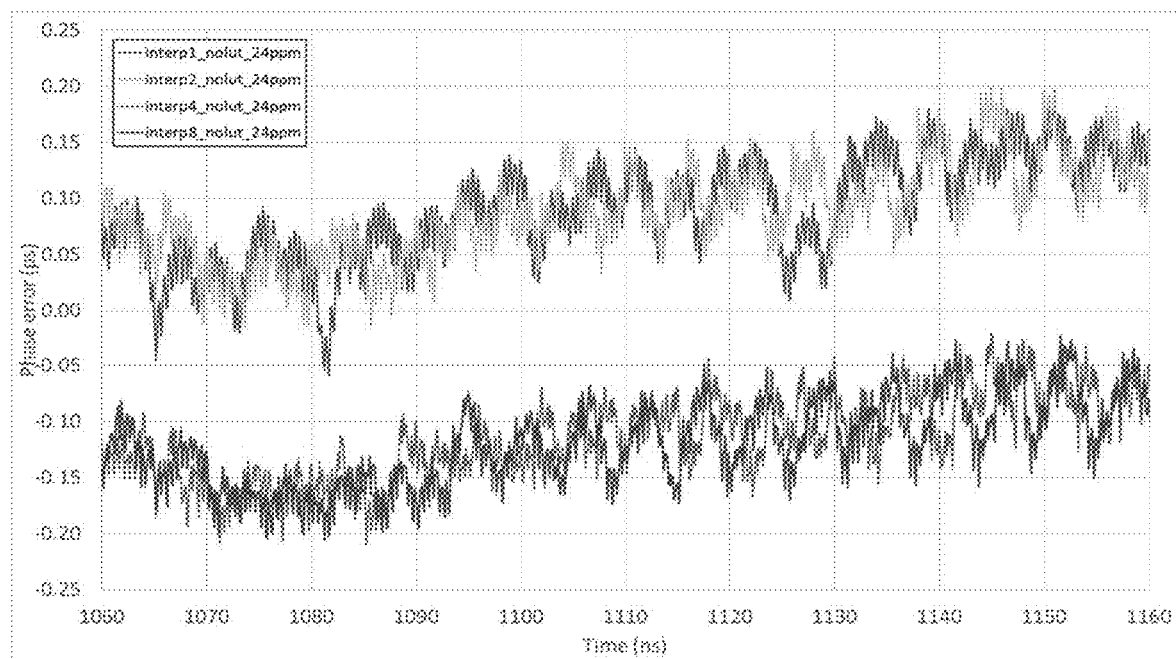
Figure 12J:
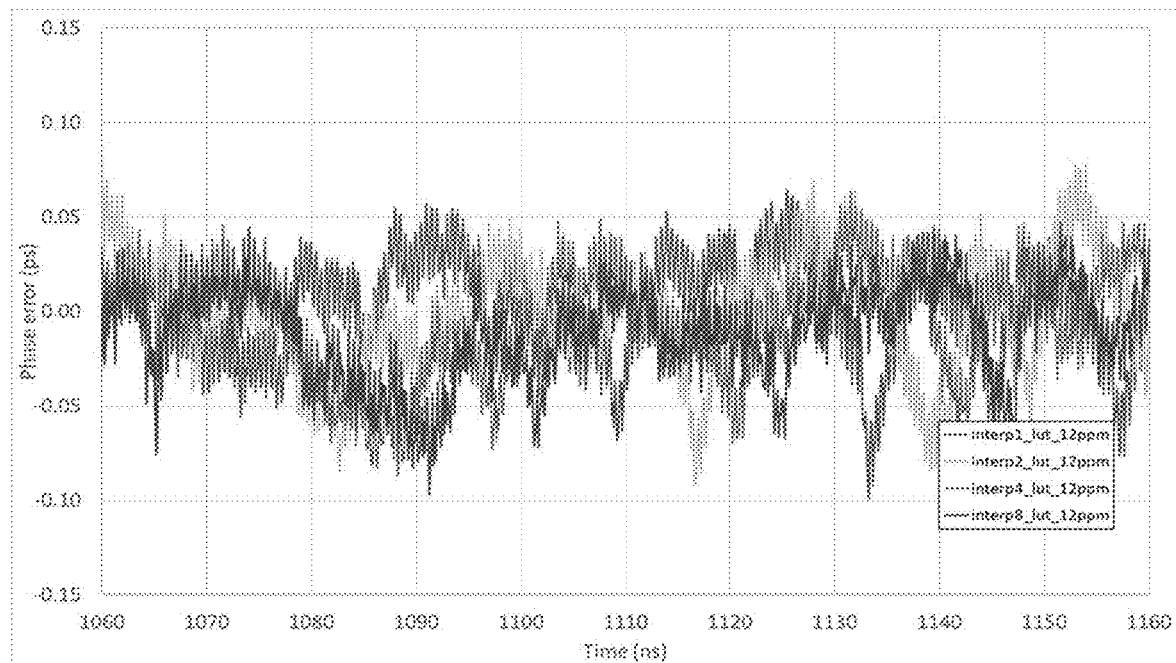
Figure 12K:
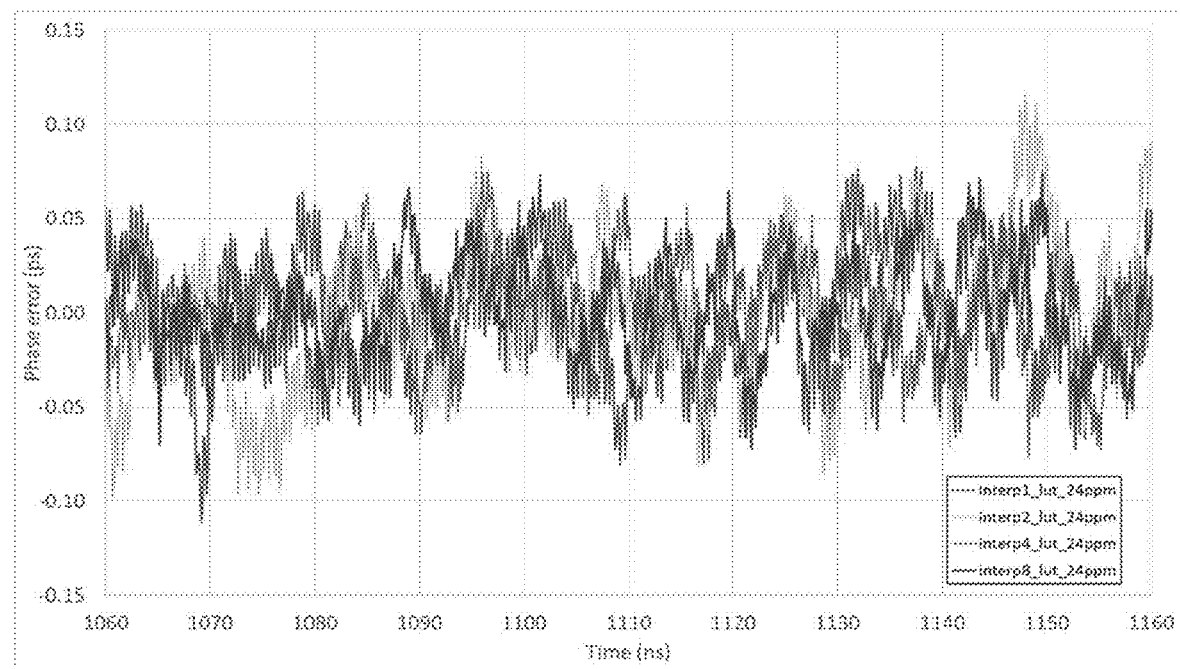
Figure 12L:
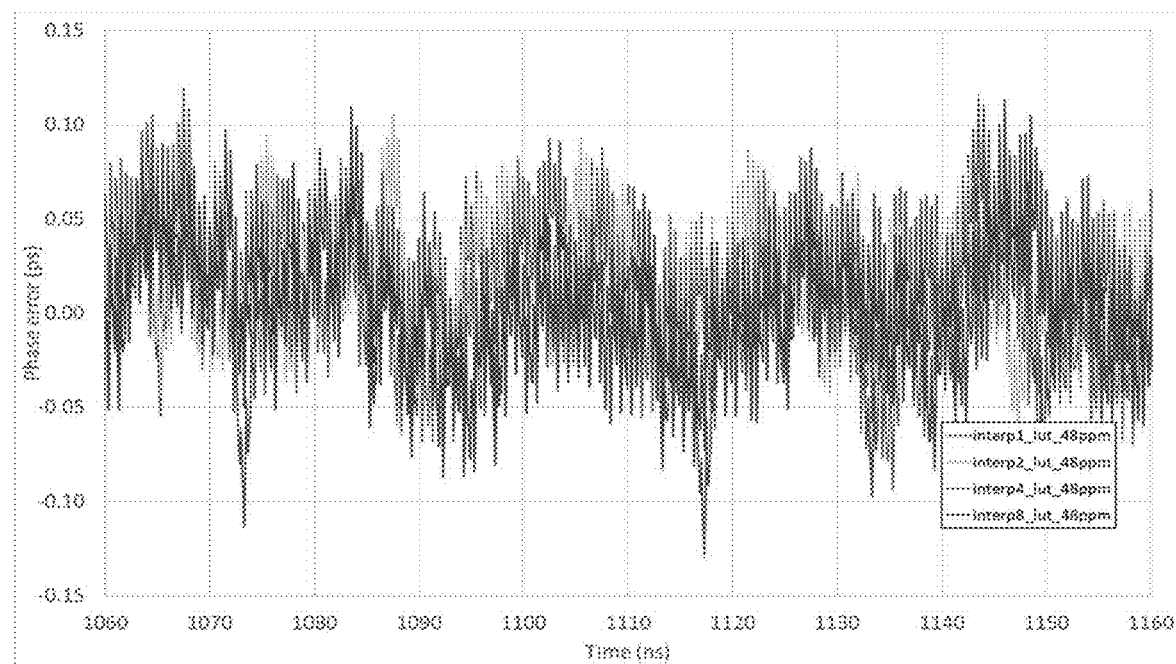
Figure 12M:
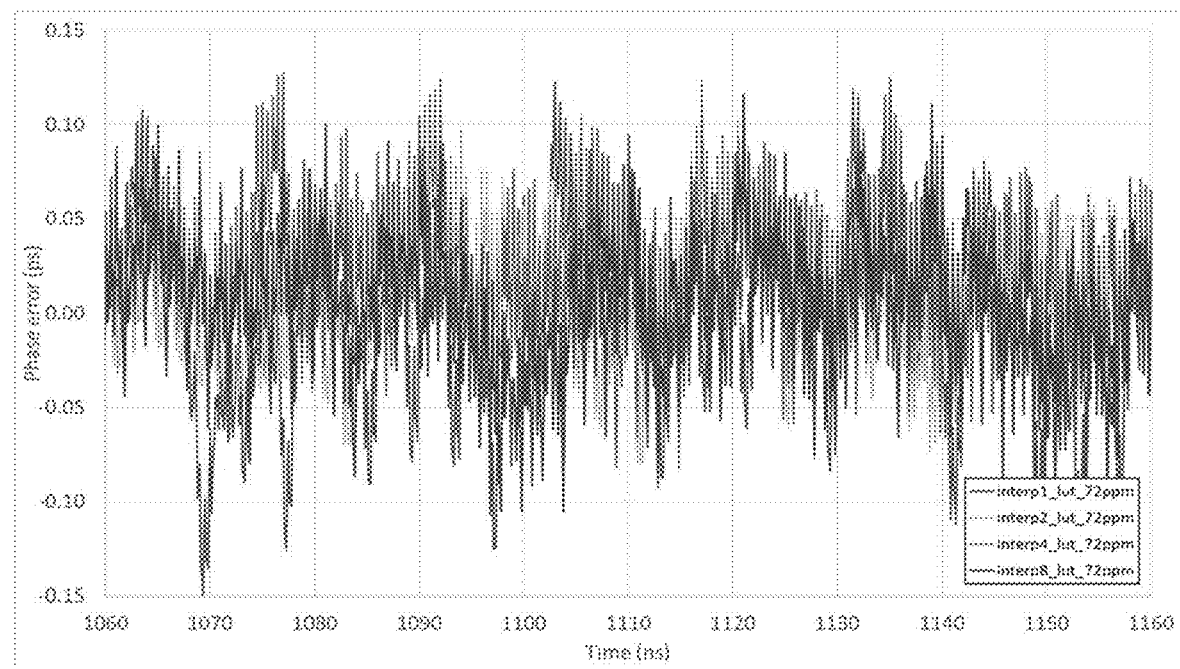
Figure 12N:
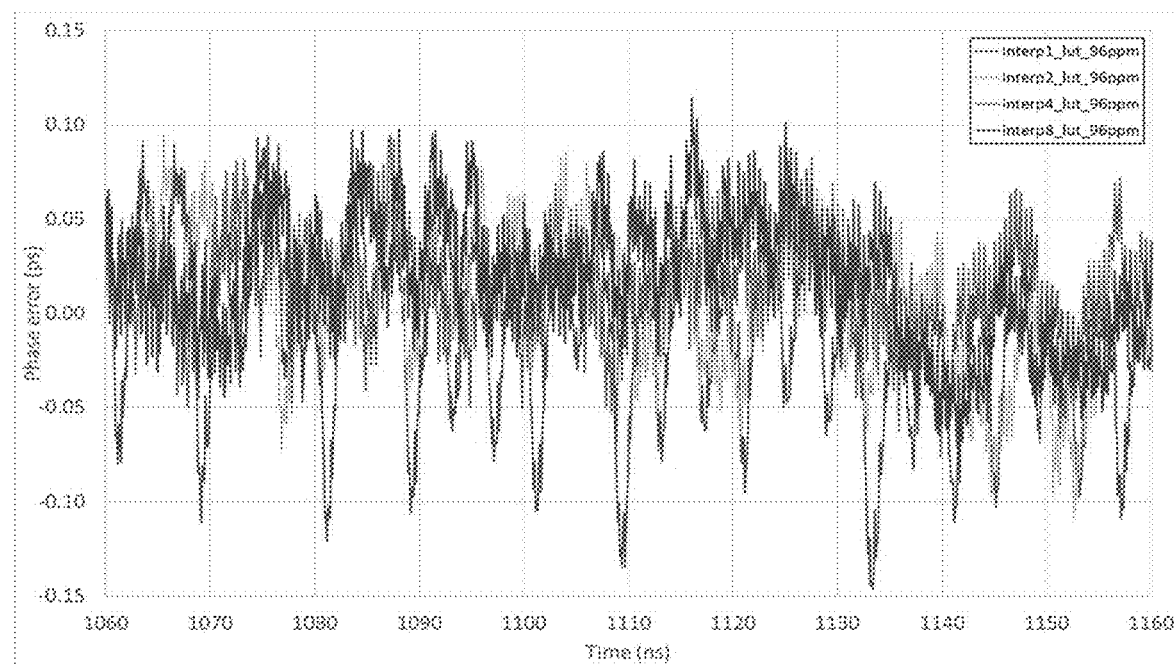
Figures 13, 14:
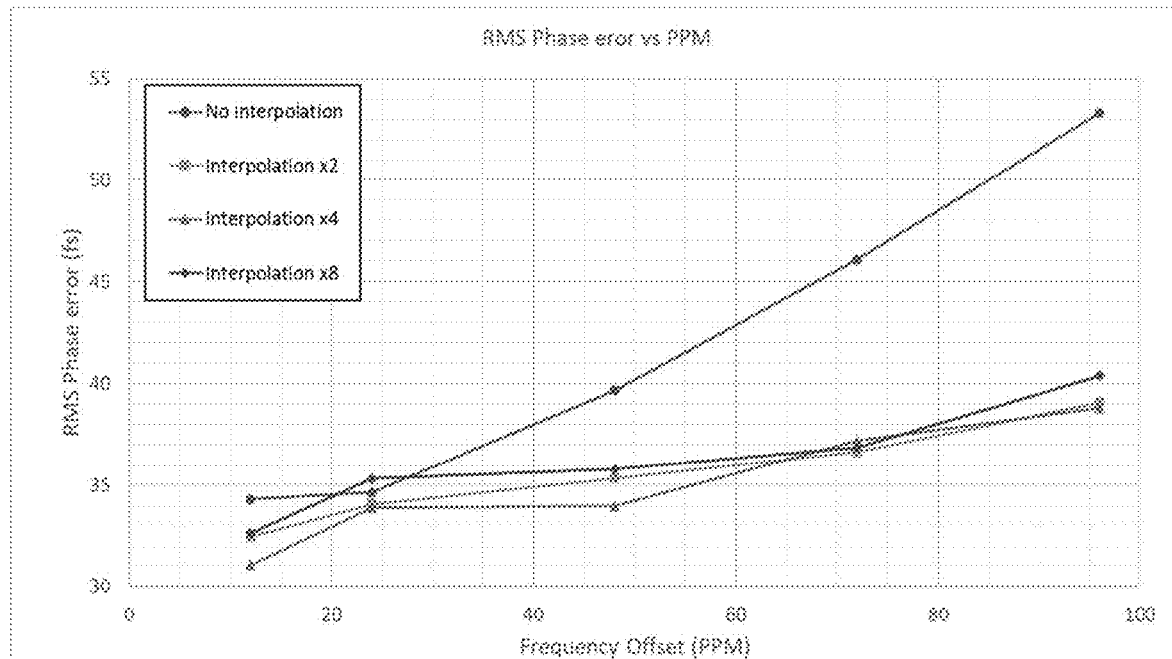
FIG. 13 is a graph showing phase error with respect to frequency offset using various interpolation modes, according to various embodiments of the present disclosure.
FIG. 14 is a table showing jitter results using various interpolation modes, according to various embodiments of the present disclosure.

FIGS. 11A-11J are graphs showing phase noise simulation results using various interpolation modes. FIGS. 12A-12N are graphs showing phase error simulation results using various interpolation modes. FIG. 13 is a graph 210 showing phase error with respect to frequency offset using various interpolation modes. The graph 210 may represent transient extracted simulations of various digital core processors. It may be noted that the systems and methods of the present disclosure may be applicable to conventional phase rotator designs, but can also be applied to other (new) phase rotators.

FIG. 14 is a table 220 showing jitter results using various interpolation modes. It may be noted that the present embodiments provide significant improvement over conventional system (no interpolation), as seen for ×2, ×4, and ×8 modes. This may be applicable to ppm jitter offsets greater than 24, which may cause minimal additional jitter, even up to 96 ppm. Due to extraction asymmetry, the simulations shown in the table 220 for no interpolation and ×2 interpolation may possibly be optimistic. Therefore, improvement using the ×4 and ×8 modes may provide greater results.

FIGS. 15A-15C are screen shots showing an example of results of a test offset process for improving Look-Up Table (LUT) operating code. FIG. 15A shows a plot of trial LUTs with different offsets from LUT locations 64 to 192. FIG. 15B shows a plot of a magnified portion of the previous plot of FIG. 15A. The magnified portion shows triangular trial offsets more clearly. Also, FIG. 15C shows a plot of jitter vs trial offsets and illustrates jitter gradually approaching a minimum (e.g., about 1.9) near an "ideal" offset value.

Also, FIG. 15A-15C show a demonstration of the trial offsets for the LUT, whereby a series of trial LUT candidates can be evaluated. Each LUT candidate include a different offset value at location 128, ranging from −20 to +20. Continuity is retained by using a piecewise linear offset, starting from location 64 to location 192, shown in FIGS. 15A and 15B as LUT values vs LUT locations for seven different values of the trial LUT. Each of the trial LUTs is evaluated by writing it into the LUT and evaluating the phase rotator output jitter. FIG. 15C shows the results in this regard, which includes the integrated jitter vs the peak offset value. In this case, the 0 value gave the best value and should therefore be used in the LUT. However, if a different value gives a lower jitter (or the lowest jitter of the group of values), then this value can be used instead by replacing the value location with the new value. Under normal circumstances, the full range of jitter vs offset does not necessarily need to be evaluated. The smaller numbers near 0 may be tested and the larger values can be tested only if the smaller ones showed improvement.

According to a first technique or algorithm, a test control device may be configured to implement a search-like gradient descent (e.g., used to optimize neural network weights, among other applications) using the integrated jitter as a "cost function." At a given location, the test control device may be configured to find a gradient. That is, a derivative of a small change in the LUT with respect to the cost function may be calculated.

This first technique can be done empirically using small changes to the LUT (e.g., by applying a small triangular offset (see FIG. 15B) at a given location) and seeing the effect on the jitter. If the jitter decreases, then this indicates the likelihood that the gradient descends in that direction. In this case, the technique may include continuing to make changes in that direction until the jitter no longer improves. After a number of iterations, the technique may include keeping only changes to the LUT that improve the jitter. This technique can be performed throughout the entire LUT (e.g., all data locations in the LUT). In some embodiments, it may be beneficial to leave one point untouched as a reference point. Therefore, this technique can start with offsets over a large portion and then gradually reduce the length of the test offset.

Figure 16A:
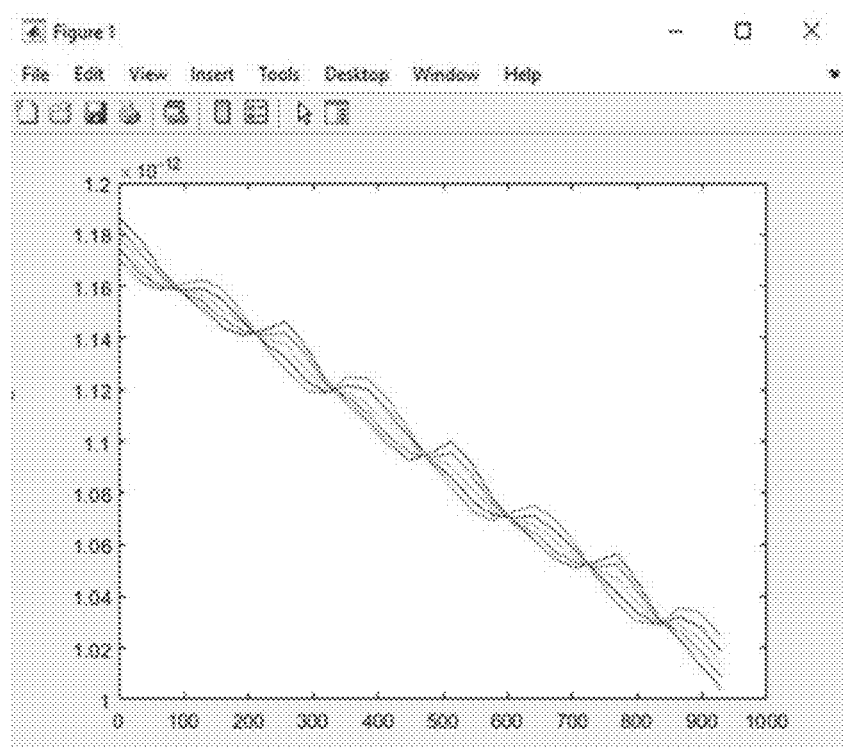
FIGS. 16A and 16B are graphs showing jitter response to LUT value adjustments, according to various embodiments of the present disclosure.
Figure 16B:
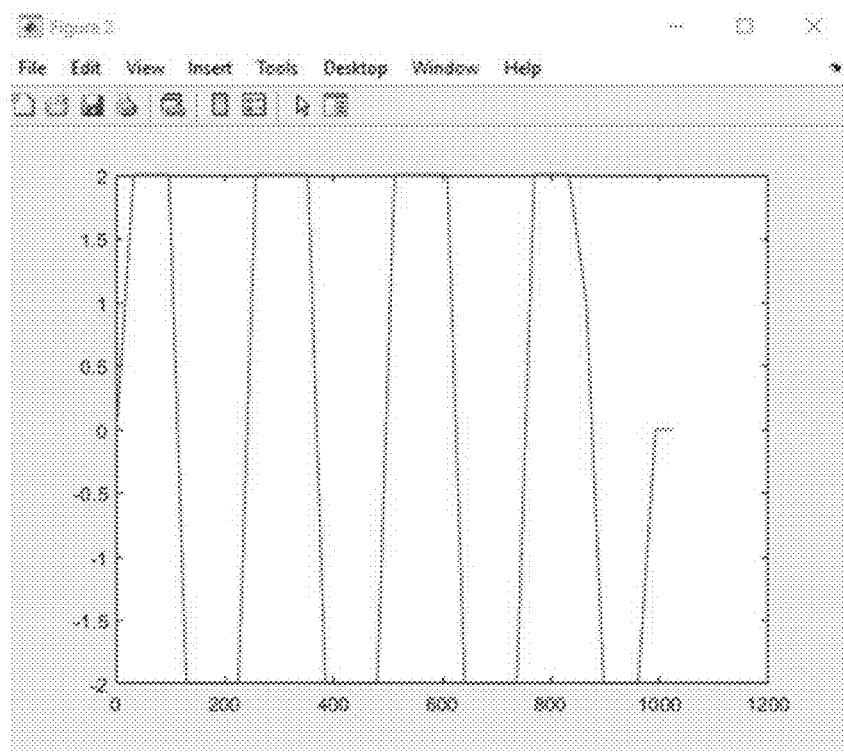

FIGS. 16A and 16B are screen shots showing graphs of jitter responses to LUT value adjustments by utilizing another linearization optimization technique. In FIGS. 16A and 16B, an example test is shown where the results were obtained by an iteration method on a digital core processor under current development. FIG. 16A shows the measured jitter with small adjustments made to the LUT values at different values. The adjustments are piecewise linear triangular function 64 steps long, with a peak ranging from −2 to +2 in steps of 1 (i.e., −2, −1, 0, +1, and +2) and are added to the LUT, starting at locations 0, 32, 64, . . . , 960. At each different location, the five different offset values are individually tested and the best value is used before testing the next location. FIG. 16A shows the jitter progressively improving with each iteration. FIG. 16B shows the LUT offset values (i.e., the difference from a straight line from 0 to 1023) at the end of the calibration round. Before the run, each of the offset values may start at zero (0).

This second technique for initial calibration may include many advantages. However, in some case, an issue with the second technique is that it may take a long time to reach the optimal state since only small steps are taken. However, this issue can be resolved by using a modified technique. The modified second technique may include a "genetic" algorithm to test many trial offsets simultaneously. The current LUT may be tested against many trial "strains," which may include random offsets (e.g., "mutations") of different strengths and sizes, and then the jitter for each strain can be tested. The strain with the best jitter value can be selected. Alternatively, multiple strains with the best jitter values can be taken and averaged. If the average LUT value is better than the base value against which the technique is being tested, it is kept and used as a new base value. Otherwise, the old base value is kept and continued to be used. In this case, further iterations can be performed done. In some embodiment, each iteration may be configured such that the strength of the mutations can be gradually diminished as the performance improves, until further improvements are no longer seen. Thus, the modified second technique has been observed as having a faster initial convergence than the first technique. Nevertheless, the first technique may be better suited for fine tuning of the LUT and can also be used more effectively in a background calibration situation.

Figure 17A:
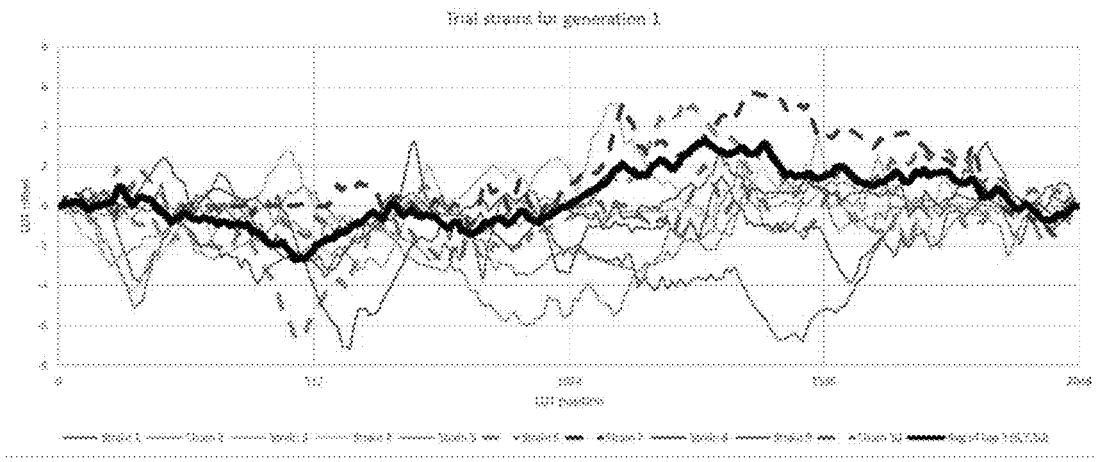
FIGS. 17A-17C are graphs showing results of another technique for testing LUT values using iterative mutations, according to various embodiments of the present disclosure.
Figure 17B:
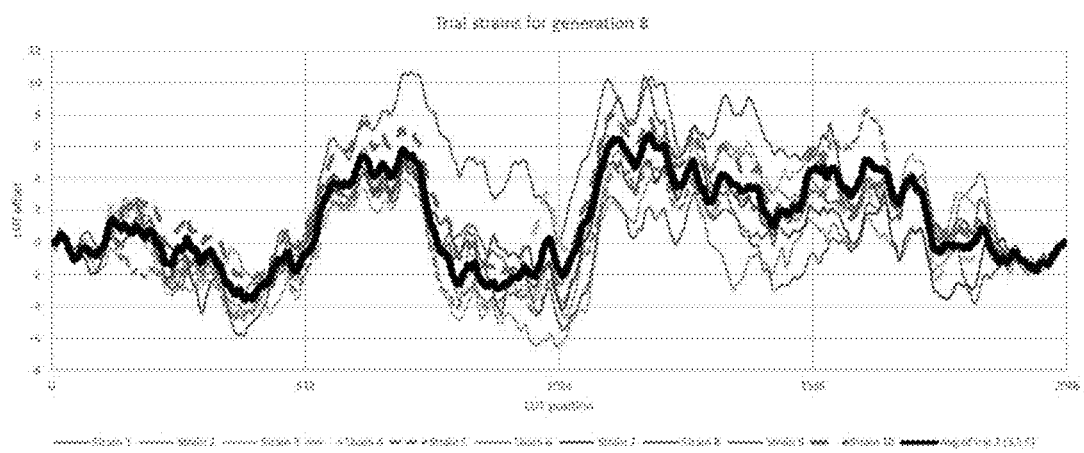
Figure 17C:
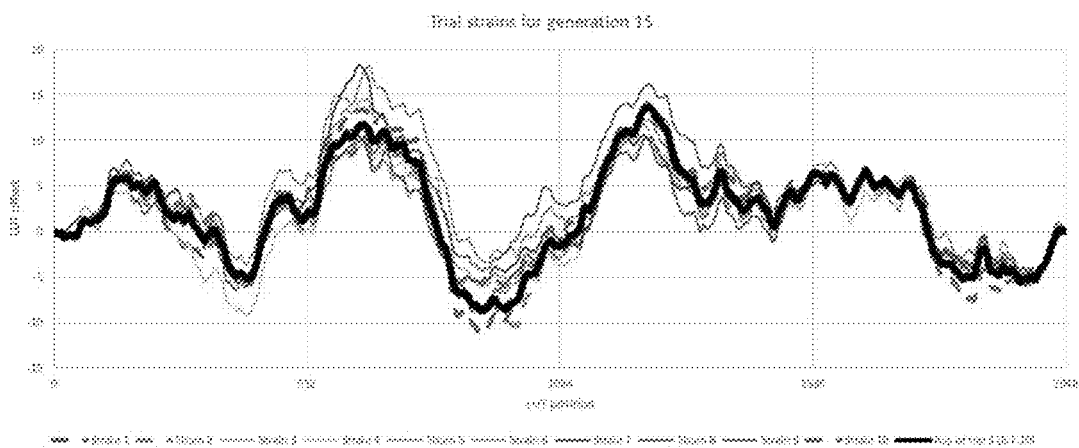

FIGS. 17A-17C are graphs showing results of the modified second technique for testing LUT values using iterative mutations. This technique may be based on "genetic" algorithm training and can create several test LUTs with random or pseudo random "mutations" (i.e., deviations from the current LUT values). In this example, a test can be conducted to measure jitter for each iteration. The test may include choosing the best X number of test strains and taking the average of them. Then this average can be kept if it is better than the current LUT. Otherwise, the mutations are rejected. The modified second technique may include continuing to iterate (e.g., by gradually reducing the strength and size of the mutations) until the LUT converges to optimal values. The initial convergence from a blind state may be performed faster than the first technique since the first technique tests small portions. However, the second technique may be unable to provide significant refinement as well as the first technique but may be better for initial calibration in a lab setup. However, if JCL is not available, one or more of the techniques may not be viable for background calibration.

Therefore, according to various embodiments of the present disclosure, a circuit (e.g., a phase rotation control system) may comprise a single Phase-Locked Loop (PLL) circuit having a main path and a return path forming a feedback loop. The circuit may also include one or more phase rotators connected to an output of the single PLL circuit outside the feedback loop. One or more adaptable Look-Up Tables (LUTs) may be populated with operating code to be provided to the one or more phase rotators for defining operating characteristics of the one or more phase rotators. The circuit may further include a control loop configured to receive phase response characteristics from the one or more phase rotators, the control loop further configured to modify the operating code of the one or more adaptable LUTs based on the phase response characteristics to reduce non-linearities of the one or more phase rotators.

According to additional embodiments, the circuit may further be defined whereby the one or more phase rotators may include a first phase rotator associated with a transmitter component and a second phase rotator associated with a receiver component. The transmitter component and receiver component may be configured to share the single PLL circuit. The circuit may further include a Clock and Data Recovery (CDR) circuit configured to receive output signals from the receiver component and provide input signals to one of the one or more adaptable LUTs and to the control loop.

Regarding this circuit, the one or more phase rotators may be configured for continuous operation, whereby the control loop may be configured to iteratively modify the operating code of the one or more adaptable LUTs based on changeable phase response characteristics of the one or more phase rotators to allow the control loop to improve linearization performance of the one or more phase rotators. The control loop may be configured to compensate for the changeable phase response characteristics caused by errors due to temperature changes, voltage shifts, and aging effects.

Also, the circuit may comprise one or more linear ramps configured to shift the output frequency of the one or more phase rotators. The control loop may be configured to modify the operating code of the one or more adaptable LUTs to improve the linearization of the one or more linear ramps. For example, the one or more adaptable LUTs may be configured to correct phase errors in the one or more phase rotators. The control loop may include an Integrated Digital-to-Analog Converter (IDAC) coding component configured for background calibration of the one or more adaptable LUTs. The IDAC coding component may be configured to receive interpolation information from an interpolator, whereby the interpolator may include a clock configured to control an update rate at which the IDAC coding component modifies the operating code of the one or more adaptable LUTs. The clock may operate faster than a digital core rate associated with the one or more adaptable LUTs. Also, the IDAC coding component may be configured to interpolate intermediate code between the operating code associated with the digital core rate.

According to some embodiments, the circuit may further comprise one or more phase rotator controllers configured to receive the operating code from the one or more adaptable LUTs and apply the operating code to the one or more phase rotators. The circuit may also include one or more frequency dividers each connected to an output of the one or more phase rotators. Furthermore, the circuit may include a spectrum analyzer configured to measure the phase response characteristics from the one or more phase rotators and forward the phase response characteristics to the control loop. The control loop may be further configured to provide an incremental step to an accumulator associated with a digital core connected to the one or more phase rotator controllers. The spectrum analyzer may be configured to perform a trial offset process, whereby the trial offset process may include applying different sets of test operating code to the one or more adaptable LUTs, monitoring non-linearities of the one or more phase rotators to determine a set of test operating code having the best results, and replacing the operating code with the set of test operating having the best results.

Therefore, the systems and methods of the present disclosure may include various points of novelty with respect to conventional systems. For example, one aspect is that the present disclosure is configured use of a clock up-sampling circuit for phase rotator code interpolation to improve update rate for linearity improvement under continuous phase ramping, which is not available in conventional systems. Also, the present circuits may take advantage of slower rate non-linearity correction through the use of a LUT in order to minimize delay to improve the bandwidth. Variable code rate selection is also available with respect to the systems of the present disclosure to control the up-sampling rate and to handle different digital core rates. The embodiments described herein demonstrate the use of iterative adaptation (e.g., similar to that used in machine learning) to improve phase rotator linearization performance. Thus, the present embodiments are capable of application to background calibration, which appears to be absent from conventional systems, to calibrate out long term and gradual effects that cannot be predetermined.

It will be appreciated that some embodiments described herein may include or utilize one or more generic or specialized processors ("one or more processors") such as microprocessors; Central Processing Units (CPUs); Digital Signal Processors (DSPs): customized processors such as Network Processors (NPs) or Network Processing Units (NPUs), Graphics Processing Units (GPUs), or the like; Field-Programmable Gate Arrays (FPGAs); and the like along with unique stored program instructions (including both software and firmware) for control thereof to implement, in conjunction with certain non-processor circuits, some, most, or all of the functions of the methods and/or systems described herein. Alternatively, some or all functions may be implemented by a state machine that has no stored program instructions, or in one or more Application-Specific Integrated Circuits (ASICs), in which each function or some combinations of certain of the functions are implemented as custom logic or circuitry. Of course, a combination of the aforementioned approaches may be used. For some of the embodiments described herein, a corresponding device in hardware and optionally with software, firmware, and a combination thereof can be referred to as "circuitry configured to," "logic configured to," etc. perform a set of operations, steps, methods, processes, algorithms, functions, techniques, etc. on digital and/or analog signals as described herein for the various embodiments.

Moreover, some embodiments may include a non-transitory computer-readable medium having instructions stored thereon for programming a computer, server, appliance, device, one or more processors, circuit, etc. to perform functions as described and claimed herein. Examples of such non-transitory computer-readable medium include, but are not limited to, a hard disk, an optical storage device, a magnetic storage device, a Read-Only Memory (ROM), a Programmable ROM (PROM), an Erasable PROM (EPROM), an Electrically EPROM (EEPROM), Flash memory, and the like. When stored in the non-transitory computer-readable medium, software can include instructions executable by one or more processors (e.g., any type of programmable circuitry or logic) that, in response to such execution, cause the one or more processors to perform a set of operations, steps, methods, processes, algorithms, functions, techniques, etc. as described herein for the various embodiments.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims. Moreover, it is noted that the various elements, operations, steps, methods, processes, algorithms, functions, techniques, etc. described herein can be used in any and all combinations with each other.

What is claimed is:

1. A card comprising:
    a first transmit (Tx) component configured to connect to a second receive (Rx) component in a second card;
    a first Rx component configured to connect to a second Tx component in the second card;
    a single Phase-Locked Loop (PLL) circuit connected to both the first Tx component and the first Rx component; and
    a control circuit configured to compensate for differences between i) the first Tx component and the second Rx component, and ii) the first Rx component and the second Tx component, wherein the control circuit includes phase rotators that are used to create specific compensation and the control circuit is further configured to one or more of
        update the phase rotators at a rate that is higher than a digital core rate,
        utilize one or more adaptable Look-Up Tables (LUTs) populated with an operating code that is provided to the phase rotators for defining operating characteristics of the phase rotators, and
        perform iterative adaptation to improve linearization performance of the phase rotators.

2. The card of claim 1, wherein the iterative adaptation is performed as background calibration.

3. The card of claim 1, wherein the single PLL circuit includes a main path and a return path forming a feedback loop.

4. The card of claim 3, further comprising one or more phase rotators connected to an output of the single PLL circuit outside the feedback loop.

5. The card of claim 1, wherein the single PLL circuit is used for both the first Tx component and the first Rx component.

6. The card of claim 1, wherein the control circuit is further configured to compensate for the changeable phase response characteristics caused by errors due to at least one of temperature changes, voltage shifts, and aging effects.

7. A method implemented in circuitry comprising:
    connecting a first transmit (Tx) component to a second receive (Rx) component;
    connecting a first Rx component to a second Tx component;
    utilizing a single Phase-Locked Loop (PLL) circuit for both the first Tx component and the first Rx component; and
    compensating for differences between i) the first Tx component and the second Rx component, and ii) the first Rx component and the second Tx component, wherein the compensating utilizes phase rotators that provide specific compensation, and wherein the compensating further includes one or more of
        updating the phase rotators at a rate that is higher than a digital core rate,
        utilizing one or more adaptable Look-Up Tables (LUTs) populated with operating codes that are provided to the phase rotators for defining operating characteristics of the phase rotators, and
        performing iterative adaptation to improve linearization performance of the phase rotators.

8. The method of claim 7, wherein the iterative adaptation is performed as background calibration.

9. The method of claim 7, wherein the single PLL circuit includes a main path and a return path forming a feedback loop.

10. The method of claim 9, wherein the compensating utilizes one or more phase rotators connected to an output of the single PLL circuit outside the feedback loop.

11. The method of claim 7, wherein the single PLL circuit is used for both the first Tx component and the first Rx component.

12. The method of claim 7, wherein the compensating further includes compensating for the changeable phase response characteristics caused by errors due to at least one of temperature changes, voltage shifts, and aging effects.

13. A card comprising:
    a first transmit (Tx) component configured to connect to a second receive (Rx) component in a second card;
    a first Rx component configured to connect to a second Tx component in the second card;
    a single Phase-Locked Loop (PLL) circuit connected to both the first Tx component and the first Rx component; and
    a control circuit configured to compensate for differences between i) the first Tx component and the second Rx component, and ii) the first Rx component and the second Tx component, wherein the control circuit includes phase rotators that are used to create specific compensation and the control circuit is configured update the phase rotators at a rate that is higher than a digital core rate.

14. The card of claim 13, wherein the single PLL circuit includes a main path and a return path forming a feedback loop.

15. The card of claim 14, further comprising one or more phase rotators connected to an output of the single PLL circuit outside the feedback loop.

16. The card of claim 13, wherein the single PLL circuit is used for both the first Tx component and the first Rx component.

17. The card of claim 13, wherein the control circuit is further configured to compensate for the changeable phase response characteristics caused by errors due to at least one of temperature changes, voltage shifts, and aging effects.

18. The card of claim 13, wherein the control circuit further includes one or more adaptable Look-Up Tables (LUTs) populated with operating code to be provided to the phase rotators for defining operating characteristics of the phase rotators.

19. The card of claim 13, wherein the control circuit is further configured to perform iterative adaptation to improve linearization performance of the phase rotators.

20. The card of claim 19, wherein the iterative adaptation is performed as background calibration.

* * * * *